(12) United States Patent
Hashimoto et al.

(10) Patent No.: US 12,148,632 B2
(45) Date of Patent: Nov. 19, 2024

(54) SUBSTRATE PROCESSING APPARATUS AND CLEANING METHOD OF MIST GUARD

(71) Applicant: Tokyo Electron Limited, Tokyo (JP)

(72) Inventors: Yusuke Hashimoto, Koshi (JP); Daisuke Goto, Koshi (JP); Kanta Mori, Koshi (JP); Jiro Higashijima, Koshi (JP); Nobuhiro Ogata, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 74 days.

(21) Appl. No.: 17/810,385

(22) Filed: Jul. 1, 2022

(65) Prior Publication Data
US 2023/0001458 A1    Jan. 5, 2023

(30) Foreign Application Priority Data

Jul. 2, 2021   (JP) .................. 2021-110479

(51) Int. Cl.
*H01L 21/67* (2006.01)
*B05B 1/10* (2006.01)
*B08B 3/04* (2006.01)
*B08B 3/08* (2006.01)

(52) U.S. Cl.
CPC .... *H01L 21/67051* (2013.01); *H01L 21/6704* (2013.01); *B05B 1/10* (2013.01); *B08B 3/048* (2013.01); *B08B 3/08* (2013.01)

(58) Field of Classification Search
CPC ............... H01L 21/6704; H01L 21/67051
See application file for complete search history.

(56) References Cited

U.S. PATENT DOCUMENTS

| 2012/0192899 A1* | 8/2012 | Higashijima | ..... H01L 21/68742 134/166 R |
| 2014/0261163 A1* | 9/2014 | Kishita | ............. H01L 21/68714 118/52 |

FOREIGN PATENT DOCUMENTS

| JP | 2009-141280 A | 6/2009 |
| JP | 2018-147979 A | 9/2018 |

OTHER PUBLICATIONS

Machine translation of JP 2018147979 A, dated Sep. 2018. (Year: 2018).*

* cited by examiner

*Primary Examiner* — Joseph L. Perrin
*Assistant Examiner* — Kevin G Lee
(74) *Attorney, Agent, or Firm* — Pearne & Gordon LLP

(57) ABSTRACT

A substrate processing apparatus includes a holder configured to hold a substrate; a driving unit configured to rotate the holder; an inner cup body provided in the holder to surround the substrate held by the holder; a mist guard, surrounding the holder and the inner cup body, configured to be moved up and down; a cleaning liquid supply configured to supply a cleaning liquid; and a controller. The controller is configured to perform: supplying a processing liquid to the substrate from a processing liquid supply, in a state that the substrate is held by the holder and the mist guard is raised; and dispersing, after the supplying of the processing liquid, the cleaning liquid supplied from the cleaning liquid supply to an entire inner peripheral surface of the mist guard, in a state that the substrate is carried out from the holder and the mist guard is raised.

17 Claims, 17 Drawing Sheets

SUBSTRATE PROCESSING APPARATUS AND CLEANING METHOD OF MIST GUARD

CROSS-REFERENCE TO RELATED APPLICATION

This application claims the benefit of Japanese Patent Application No. 2021-110479 filed on Jul. 2, 2021, the entire disclosure of which is incorporated herein by reference.

TECHNICAL FIELD

The various aspects and embodiments described herein pertain generally to a substrate processing apparatus and a cleaning method of a mist guard.

BACKGROUND

Currently, when microfabricating a substrate (for example, a semiconductor wafer), there is performed a processing of forming a film of a processing liquid on a surface of the substrate by supplying the processing liquid to the substrate being rotated, while scattering the processing liquid from the substrate by a centrifugal force. The processing liquid scattered from the substrate are dispersed around the substrate, and some of them becomes mist. Patent Documents 1 and 2 disclose a mist guard disposed in a processing chamber to surround the substrate in order to suppress the mist from adhering to an inner wall of the processing chamber.

Patent Document 1: Japanese Patent Laid-open Publication No. 2018-147979
Patent Document 2: Japanese Patent Laid-open Publication No. 2009-141280

SUMMARY

In one exemplary embodiment, a substrate processing apparatus includes a holder configured to hold a substrate; a driving unit configured to rotate the holder; an inner cup body provided in the holder to surround the substrate held by the holder from an outside thereof; a mist guard, surrounding the holder and the inner cup body from an outside thereof such that the holder and the inner cup body are located inside the mist guard, configured to be moved up and down; a processing liquid supply configured to supply a processing liquid to the substrate held by the holder; a cleaning liquid supply configured to supply a cleaning liquid; and a controller. The controller is configured to perform: supplying the processing liquid to the substrate from the processing liquid supply, in a state that the substrate is held by the holder and the mist guard is raised; and dispersing, after the supplying of the processing liquid, the cleaning liquid supplied from the cleaning liquid supply to an entire inner peripheral surface of the mist guard, in a state that the substrate is carried out from the holder and the mist guard is raised.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
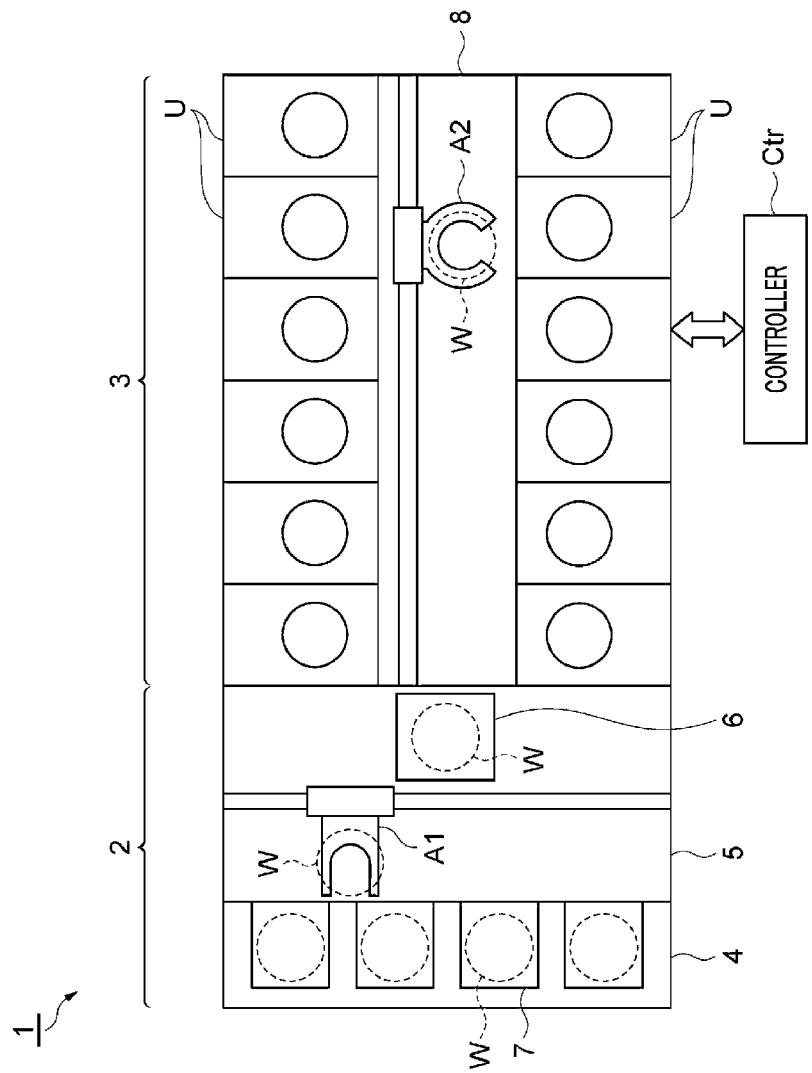
FIG. 1 is a plan view schematically illustrating an example of a substrate processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

In the following description, same parts or parts having same functions will be assigned same reference numerals, and redundant description thereof will be omitted. Further, in the present specification, when referring to the top, bottom, right, and left of the drawing, the direction of the notation in the drawing is taken as a reference.

(Substrate Processing System)

First, referring to FIG. 1, a substrate processing system 1 (substrate processing apparatus) configured to process a substrate W will be explained. The substrate processing system 1 includes a carry-in/out station 2, a processing station 3, and a controller Ctr (control unit). The carry-in/out station 2 and the processing station 3 may be arranged side by side in, for example, a horizontal direction.

The substrate W may be of a circular plate shape, or may be of a plate shape such as a polygon other than a circle. The substrate W may have a groove portion which is partially cut out. The groove portion may be, for example, a notch (a U-shaped or V-shaped groove) or a linear portion (so-called orientation flat) extending linearly. The substrate W may be, by way of non-limiting example, a semiconductor substrate (silicon wafer), a glass substrate, a mask substrate, a flat panel display (FPD) substrate, or any of various other kinds of substrates. The substrate W may have a diameter of, e.g., about 200 mm to 450 mm.

The carry-in/out station 2 includes a placing section 4, a carry-in/out section 5, and a shelf unit 6. The placing section 4 includes a plurality of placing tables (not shown) arranged in a width direction (up-and-down direction in FIG. 1). Each placing table is configured to place a carrier 7 (receptacle) thereon. The carrier 7 is configured to accommodate at least one substrate W in a sealed state. The carrier 7 includes an opening/closing door (not shown) through which the substrate W is carried in or out.

The carry-in/out section 5 is disposed adjacent to the placing section 4 in the direction in which the carry-in/out station 2 and the processing station 3 are arranged (left-and-right direction of FIG. 1). The carry-in/out section 5 includes an opening/closing door (not shown) provided to correspond to the placing section 4. If the opening/closing door of the carrier 7 and the opening/closing door of the carry-in/out section 5 are both opened in the state that the carrier 7 is placed on the placing section 4, the inside of the carry-in/out section 5 and the inside of the carrier 7 communicate with each other.

The carry-in/out section 5 incorporates therein a transfer arm A1 and the shelf unit 6. The transfer arm A1 is configured to be movable horizontally in the width direction (up-and-down direction of FIG. 1), movable up and down in a vertical direction, and pivotable about a vertical axis. The transfer arm A1 serves to take out the substrate W from the carrier 7 and hand it over to the shelf unit 6, and also serves to receive the substrate W from the shelf unit 6 and return it back into the carrier 7. The shelf unit 6 is located near the processing station 3, and is configured as a transit area for the transfer of the substrate W between the carry-in/out section 5 and the processing station 3.

The processing station 3 includes a transfer section 8 and a plurality of processing units U. For example, the transfer section 8 extends horizontally in the direction (left-and-right direction of FIG. 1) in which the carry-in/out station 2 and the processing station 3 are arranged. The transfer section 8 incorporates a transfer arm A2 therein. The transfer arm A2 is configured to be movable horizontally in a lengthwise direction (left-and-right direction in FIG. 1) of the transfer section 8, movable up and down in the vertical direction, and pivotable about a vertical axis. The transfer arm A2 serves to take out the substrate W from the shelf unit 6 and pass it over to the corresponding processing unit U, and also serves to receive the substrate W from the processing unit U and return it back into the shelf unit 6.

The plurality of processing units U are arranged side by side in a row along the lengthwise direction (left-and-right direction of FIG. 1) of the transfer section 8 at both sides of the transfer section 8. The processing units U are configured to perform predetermined processings (for example, a cleaning processing for the substrate W, an etching processing for a film formed on a surface of the substrate W, and so forth) on the substrate W. Details of the processing units U will be described later.

The controller Ctr is configured to control the substrate processing system 1 partially or in overall. Details of the controller Ctr will be described later.

(Processing Unit)

Now, referring to FIG. 2, the processing unit U will be described in detail. The processing unit U includes a chamber 10, a blower unit 20, a rectifying unit 30, a rotating/holding unit 40, a recovery cup 50, a cleaning cup 60, a mist guard 70, an upper supply unit 80 (a processing liquid supply and a cleaning liquid supply), and a lower supply unit 90 (additional cleaning liquid supply and a gas supply).

The chamber 10 is configured such that a processing of the substrate W by a processing liquid or the like is performed therein. A non-illustrated carry-in/out opening is formed at a sidewall of the chamber 10. The substrate W is carried into the chamber 10 and carried out of the chamber 10 through this carry-in/out opening by the transfer arm A2.

The blower unit 20 is disposed so as to cover an opening 10a formed at a ceiling wall of the chamber 10. The blower unit 20 is configured to form a downflow within the chamber 10 based on a signal from the controller Ctr.

The rectifying unit 30 is disposed at an upper portion within the chamber 10, and it extends horizontally so that the internal space of the chamber 10 is partitioned into a space above it and a space below it. The rectifying unit 30 is a plate-shaped body provided with a multiple number of holes, such as a punching metal, an extended metal, a wire mesh, or the like. The rectifying unit 30 is configured to rectify the downflow formed by the blower unit 20 to thereby uniform a distribution of the downflow in the chamber 10 below the rectifying unit 30.

The rotating/holding unit 40 includes a rotation shaft 41, a driving unit 42, a supporting plate 43 (holder), a plurality of supporting pins 44, an annular member 45, and an inner cup body 46. The rotation shaft 41 is a hollow tubular member extending along a vertical direction. The rotation shaft 41 is configured to be rotatable around a central axis Ax.

The driving unit 42 is connected to the rotation shaft 41. The driving unit 42 is operated based on an operation signal from the controller Ctr, and is configured to rotate the rotation shaft 41. The driving unit 42 may be a power source such as, but not limited to, an electric motor.

The supporting plate 43 is, for example, a flat plate having a ring shape, and extends horizontally. That is, a through hole 43a is formed at a central portion of the supporting plate 43. An inner periphery of the supporting plate 43 is connected to a leading end of the rotation shaft 41. Accordingly, the supporting plate 43 is configured to be rotated around the central axis Ax of the rotation shaft 41 along with the rotation shaft 41.

The plurality of supporting pins 44 are provided at the supporting plate 43 so as to be protruded upwards from a top surface 43b of the supporting plate 43. The plurality of supporting pins 44 are configured such that leading ends thereof are in contact with a rear surface of the substrate W to thereby support the substrate W in a substantially horizontal manner. The plurality of supporting pins 44 may have, for example, a columnar shape or a frustum shape. In the vicinity of an outer periphery of the supporting plate 43, the plurality of supporting pins 44 may be arranged at a substantially equal distance therebetween so that they form a circular shape as a whole when viewed from above. By way of example, when the number of the plurality of supporting pins 44 is twelve, these supporting pins 44 may be arranged at an angular distance of about 30°.

The annular member 45 has an annular shape (for example, a circular ring shape), and is provided at the supporting plate 43 so as to be protruded upwards from the top surface 43b of the supporting plate 43. The annular member 45 surrounds the through hole 43a of the supporting plate 43 from the outside thereof, and is located inside the plurality of supporting pins 44. Thus, a space surrounded by the annular member 45 and the top surface 43b of the supporting plate 43 forms a storage space V in which a cleaning liquid (to be described later) can be stored.

Figure 2:
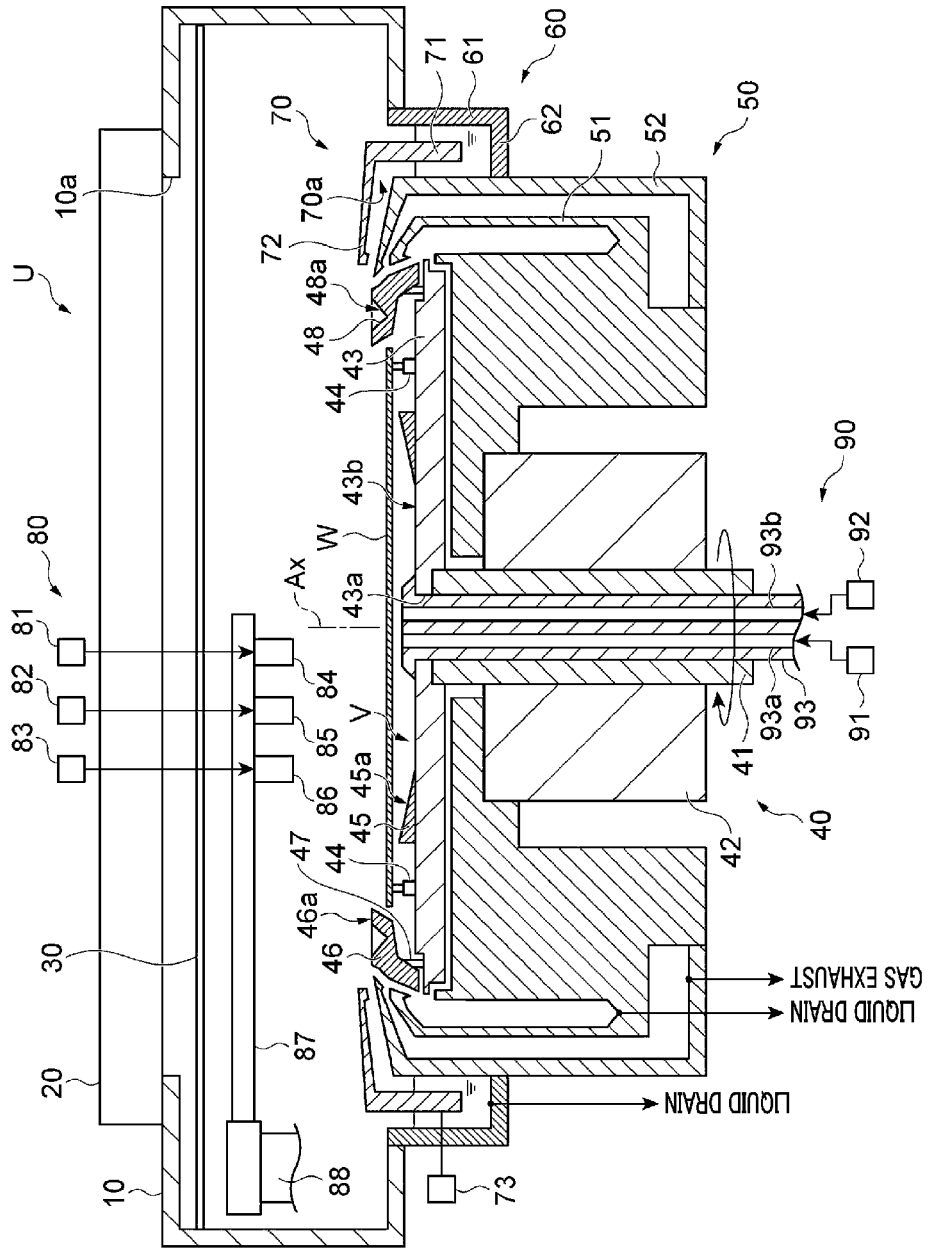
FIG. 2 is a cross sectional view schematically illustrating an example (first example) of a processing unit.

As illustrated in FIG. 2, an inner wall surface (inner peripheral surface) of the annular member 45 may be an inclined surface 45a that slopes upwards as it goes outwards in a diametrical direction. The inclination angle of the inclined surface 45a with respect to the top surface 43b of the supporting plate 43 is set to be an angle allowing an imaginary line of the inclined surface 45a, when it is extended outwards in the diametrical direction, not to meet the inner cup body 46 (that is, to pass above the inner cup body 46). The inclination angle of the inclined surface 45a with respect to the top surface 43b of the supporting plate 43 may be in the range of, e.g., about 10° to about 45°.

The inner cup body 46 has an annular shape (for example, a circular ring shape), and is connected to the supporting plate 43 by a plurality of connecting members 47 so that it is located above the supporting plate 43 while being spaced apart from the supporting plate 43. The inner cup body 46 is disposed so as to surround the substrate W supported by the plurality of supporting pins 44 from the outside thereof. Thus, the inner cup body 46 is configured to be rotated along with the rotation of the rotation shaft 41 around the central axis Ax of the rotation shaft 41. Since a gap exists between the inner cup body 46 and the supporting plate 43, a liquid supplied to the substrate W flows out of the inner cup body 46 and the supporting plate 43 through this gap.

An annular groove 48 extending along the entire circumference of the inner cup body 46 is formed in a top surface 46a of the inner cup body 46. The annular groove 48 is formed such that the cleaning liquid can be stored therein. In order to apply a surface tension to the cleaning liquid to allow a larger amount of cleaning liquid to be stored in the annular groove 48, a surface processing (for example, fluorine treatment) may be performed on a surface of the annular groove 48. An inner wall surface of the annular groove 48 at an outer side may be an inclined surface 48a that slopes upwards as it goes outwards in the diametrical direction, as depicted in FIG. 2. The inclination angle of the inclined surface 48a with respect to the top surface 46a of the inner cup body 46 may be, for example, in the range of about 10° to about 45°.

Each of the inclined surfaces 45a and 48a may be a flat surface or may be a non-flat surface (for example, a curved surface). For the purpose of increasing the fluidity of the cleaning liquid, a number of irregularities may be formed on the inclined surfaces 45a and 48a by, for example, dimple processing and/or embossing processing, or a plurality of grooves and/or a plurality of protrusions radially extending along the diametrical direction may be formed. Alternatively, for the purpose of increasing the fluidity of the cleaning liquid, the inclined surfaces 45a and 48a may be surface-processed or a film may be formed thereon.

The recovery cup 50 is disposed so as to surround the rotating/holding unit 40 from the outside thereof. While the rotating/holding unit 40 is configured to be rotatable, the recovery cup 50 is kept stationary without being rotated. The recovery cup 50 may be fixed to the driving unit 42, as illustrated in FIG. 2. The recovery cup 50 includes a drain cup 51 at an inner side and an exhaust cup 52 disposed to surround the drain cup 51 from the outside.

The drain cup 51 forms a cylindrical space communicating with the gap between the inner cup body 46 and the supporting plate 43, and is configured to recover the liquid flown out from the gap. A pipeline for draining the recovered liquid to the outside of the processing unit U is connected to a lower end portion of the drain cup 51.

The exhaust cup 52 forms a cylindrical space between the drain cup 51 and itself, and this space is regulated to a negative pressure. A pipeline for sucking an atmosphere in the vicinity of the inner cup body 46 and exhausting it to the outside of the processing unit U is connected to a lower end portion of the exhaust cup 52.

The cleaning cup 60 is configured to be capable of storing the cleaning liquid therein. The cleaning cup 60 has a cylindrical shape that surrounds the exhaust cup 52 from the outside, and extends so as to connect a lower end portion of the chamber 10 and the exhaust cup 52. For example, an internal space of the cleaning cup 60 (a storage space for the cleaning liquid) may be a space surrounded by the cleaning cup 60 and an upper end portion of the exhaust cup 52. As illustrated in FIG. 2, the cleaning cup 60 has a cylindrical peripheral wall portion 61 extending in a vertical direction and an annular bottom wall portion 62 extending horizontally from a lower end of the peripheral wall portion 61 toward the radially inner side (that is, toward the recovery cup 50 side). A pipeline for draining the used cleaning liquid to the outside of the processing unit U is connected to a lower end portion of the cleaning cup 60.

The mist guard 70 is arranged so as to surround the recovery cup 50 from the outside. That is, the rotating/holding unit 40 and the recovery cup 50 are located inside the mist guard 70. As illustrated in FIG. 2, the mist guard 70 includes a cylindrical portion 71 extending in the vertical direction and an annular extension 72 extending horizontally from an upper end of the cylindrical portion 71 toward the radially inner side (that is, toward the recovery cup 50 side).

The mist guard 70 is connected to a driving unit 73, and is configured to be moved up and down in the vertical direction. The mist guard 70 is movable up and down between a lowered position (see FIG. 2) where at least a lower portion of the cylindrical portion 71 is located within the cleaning cup 60 and a raised position (see FIG. 5) where the cylindrical portion 71 is entirely or almost entirely exposed from the cleaning cup 60. At the lowered position, at least the lower portion of the cylindrical portion 71 is immersed in the cleaning liquid in the state that the cleaning liquid is stored in the storage space in the cleaning cup 60. At the raised position, mist, which is generated as the processing liquid (to be described later) supplied to the substrate W scatters around, adheres to an inner peripheral surface 70a of the mist guard 70. The mist guard 70 suppresses this mist from adhering to an inner wall of the chamber 10.

The upper supply unit 80 is configured to supply a liquid to the top surface of the substrate W, the supporting plate 43, or the inner cup body 46. The upper supply unit 80 includes supplies 81 to 83, nozzles 84 to 86, an arm 87 (holding arm), and a driving unit 88.

The supply 81 includes a liquid source, a valve, pump, and so forth (not shown), and is configured to supply a liquid L1 downwards from the nozzle 84 based on a signal from the controller Ctr. The liquid L1 may be an alkaline liquid. By way of example, the liquid L1 may be used as a chemical liquid for processing the substrate W (for example, a processing of removing a contaminant or a foreign material, an etching processing, etc.), or may be used as a cleaning liquid for cleaning the inner peripheral surface 70a of the mist guard 70. The alkaline chemical may contain, for example, a SC-1 solution (a mixture of ammonia, hydrogen peroxide, and pure water) or the like.

The supply 82 includes a liquid source, a valve, a pump, and so forth (not shown), and is configured to supply a liquid L2 downwards from the nozzle 85 based on a signal from the controller Ctr. The liquid L2 may be an acidic liquid. By way of example, the liquid L2 may be used as a chemical liquid for processing the substrate W (for example, a processing of removing a contaminant or a foreign material, an etching processing, etc.), or may be used as a cleaning liquid for cleaning the inner peripheral surface 70a of the mist guard 70. The acidic chemical liquid may include, by way of non-limiting example, a SC-2 solution (a mixture of hydrochloric acid, hydrogen peroxide, and pure water), SPM (a mixture of sulfuric acid, hydrogen peroxide, and pure water), $HF/HNO_3$ solution (a mixture of hydrofluoric acid and nitric acid), sulfuric acid, or the like.

The supply 83 includes a liquid source, a valve, a pump, and so forth (not shown), and is configured to supply a liquid L3 downwards from the nozzle 86 based on a signal from the controller Ctr. For example, the liquid L3 may be used as a cleaning liquid for cleaning the substrate W and the inner peripheral surface 70a of the mist guard 70. The liquid L3 may be water. The water may include, for example, pure water (DIW: deionized water), ozone water, carbonated water ($CO_2$ water), ammonia water, or the like. The water may be cold water (for example, about 10° C. or less), room-temperature water (for example, about 10° C. to 30° C.), or hot water (for example, about 30° C. or higher).

The nozzles 84 to 86 are mounted to the arm 87 while being spaced apart from each other at a preset distance. The arm 87 is located in a space above the rotating/holding unit 40. The driving unit 88 is connected to the arm 87 and is configured to move the arm 87 up and down in the vertical direction based on a signal from the controller Ctr and to move the arm 87 horizontally in the space above the rotating/holding unit 40.

The lower supply unit 90 includes supplies 91 and 92 and a nozzle 93. The supply 91 includes a liquid source, a valve, a pump, and so forth (not shown), and is configured to supply a liquid L4 upwards through a flow path 93a formed within the nozzle 93 based on a signal from the controller Ctr. The liquid L4 may be any of the liquids L1 to L3 described above. The supply 92 includes a gas source, a valve, a pump, and so forth (not shown), and is configured to supply a drying gas G upwards through a flow path 93b formed within the nozzle 93 based on a signal from the controller Ctr. The drying gas G may be, by way of non-limiting example, an inert gas (e.g., nitrogen gas).

(Details of Controller)

Figure 3:
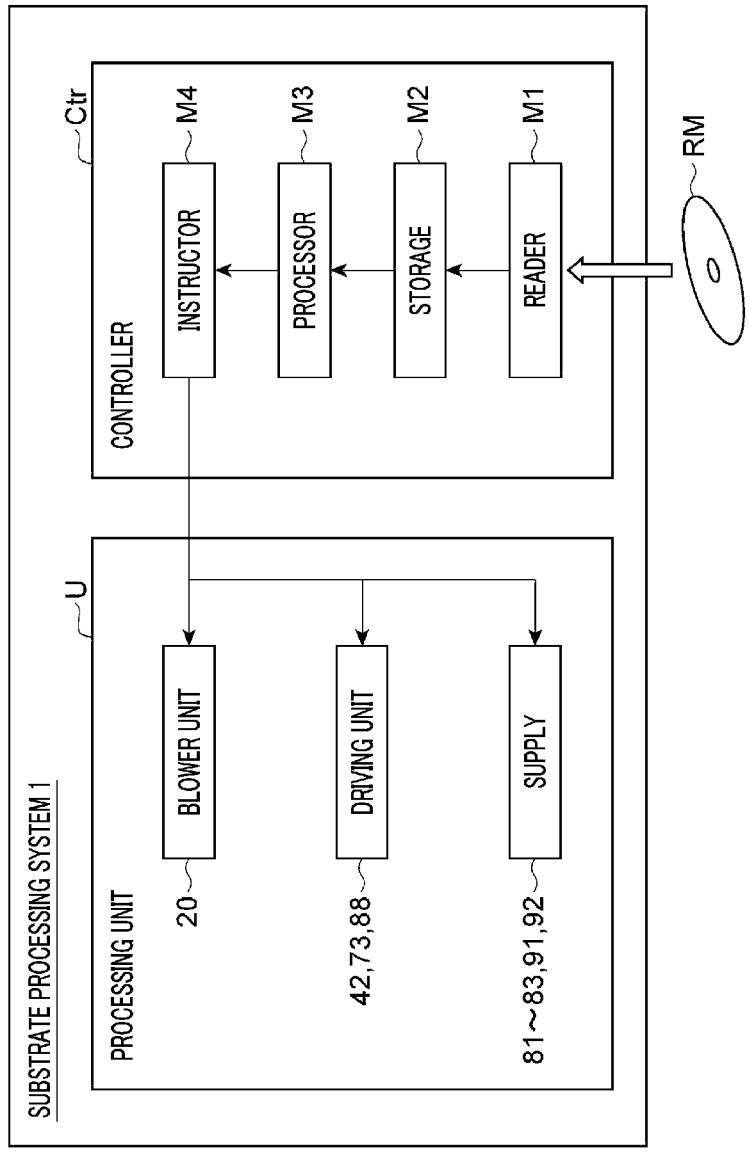
FIG. 3 is a block diagram illustrating an example of main components of the substrate processing system.

As shown in FIG. 3, the controller Ctr has, as functional modules, a reader M1, a storage M2, a processor M3, and an instructor M4. These functional modules are merely a division of functions of the controller Ctr into a plurality of modules for the sake of convenience, and do not necessarily mean that the hardware constituting the controller Ctr is divided into these modules. Each functional module is not limited to being realized by the execution of a program, and may be realized by a dedicated electric circuit (for example, a logic circuit) or an integrated circuit (ASIC: Application Specific Integrated Circuit) integrating the same.

The reader M1 is configured to read a program from a computer-readable recording medium RM. The recording medium RM stores therein a program for operating the individual components of the substrate processing system 1 including the processing unit U. The recording medium RM may be, for example, a semiconductor memory, an optical recording disk, a magnetic recording disk, or a magneto-optical recording disk. In the following, each component of the substrate processing system 1 may include the blower unit 20, the driving units 42 and 73, and the supplies 81 to 83, 91, and 92.

The storage M2 is configured to store various kinds of data therein. The storage M2 may store therein, for example, the program read out from the recording medium RM in the reader M1, setting data inputted by an operator through an external input device (not shown), and so forth.

The processor M3 is configured to process various kinds of data. The processor M3 may generate, for example, a signal for operating each component of the substrate processing system 1 based on various kinds of data stored in the storage M2.

The instructor M4 is configured to transmit the operation signal generated by the processor M3 to each component of the substrate processing system 1.

Figure 4:
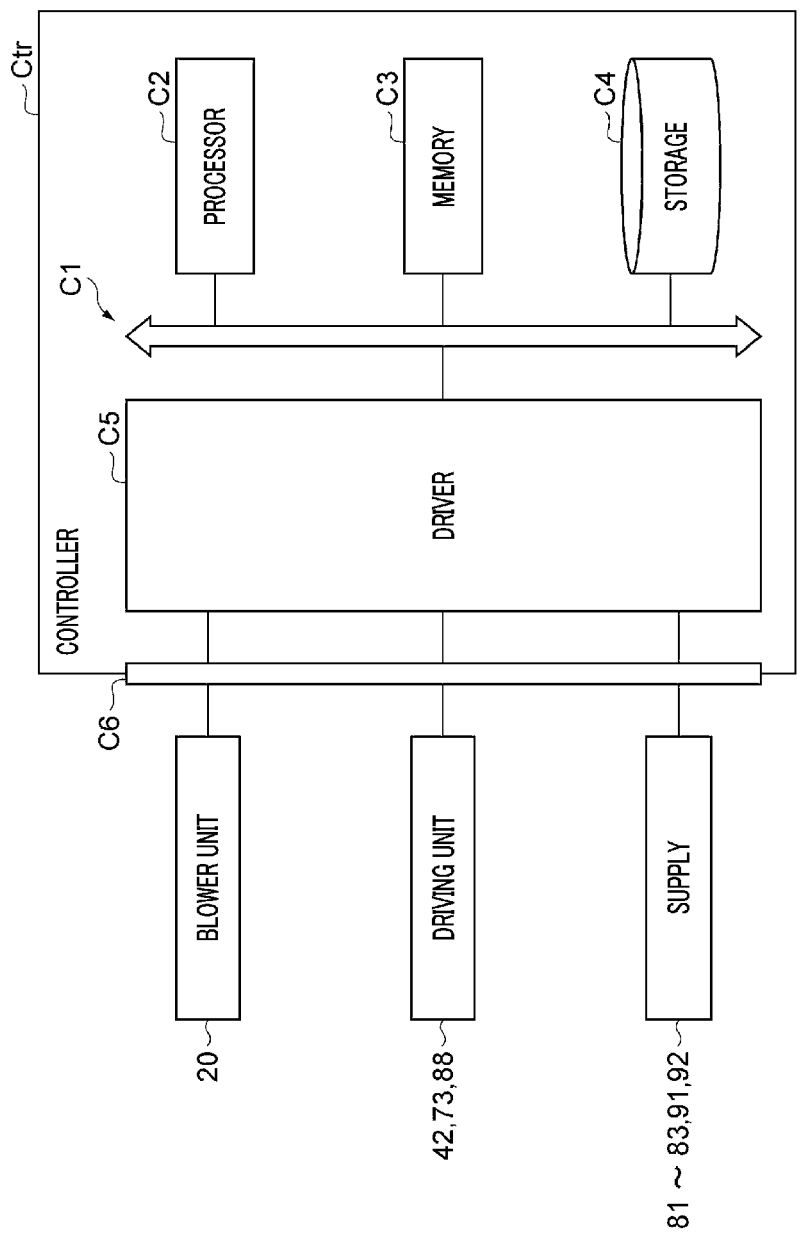
FIG. 4 is a schematic view illustrating a hardware configuration of a controller.

The hardware of the controller Ctr may be composed of, for example, one or more control computers. The controller Ctr may include a circuit C1 as a hardware configuration, as shown in FIG. 4. The circuit C1 may be composed of an electric circuitry. The circuit C1 may include a processor C2, a memory C3, a storage C4, a driver C5, and an input/output port C6.

The processor C2 may be configured to realize each of the above-described functional modules by executing a program in cooperation with at least one of the memory C3 or the storage C4 and performing an input/output of a signal through the input/output port C6. The memory C3 and the storage C4 may function as the storage M2. The driver C5 may be a circuit configured to drive the respective components of the substrate processing system 1 individually. The input/output port C6 may be configured to mediate an input/output of signals between the driver C5 and each component of the substrate processing system 1.

The substrate processing system 1 may be equipped with one controller Ctr, or may be equipped with a controller group (control unit) including a plurality of controllers Ctr. When the substrate processing system 1 has the controller group, each of the above-described functional modules may be implemented by one controller Ctr, or may be implemented by a combination of two or more controllers Ctr. When the controller Ctr includes a plurality of computers (circuits C1), each of the above-described functional modules may be implemented by one computer (circuit C1), or by a combination of two or more computers (circuits C1). The controller Ctr may have a plurality of processors C2. In this case, each of the above-described functional modules may be implemented by one processor C2, or may be implemented by a combination of two or more processors C2.

(Processing Method of Substrate and Cleaning Method of Mist Guard)

Now, referring to FIG. 5 to FIG. 10, an example of a processing method of the substrate W and a cleaning method of the mist guard 70 will be explained.

Figure 10:
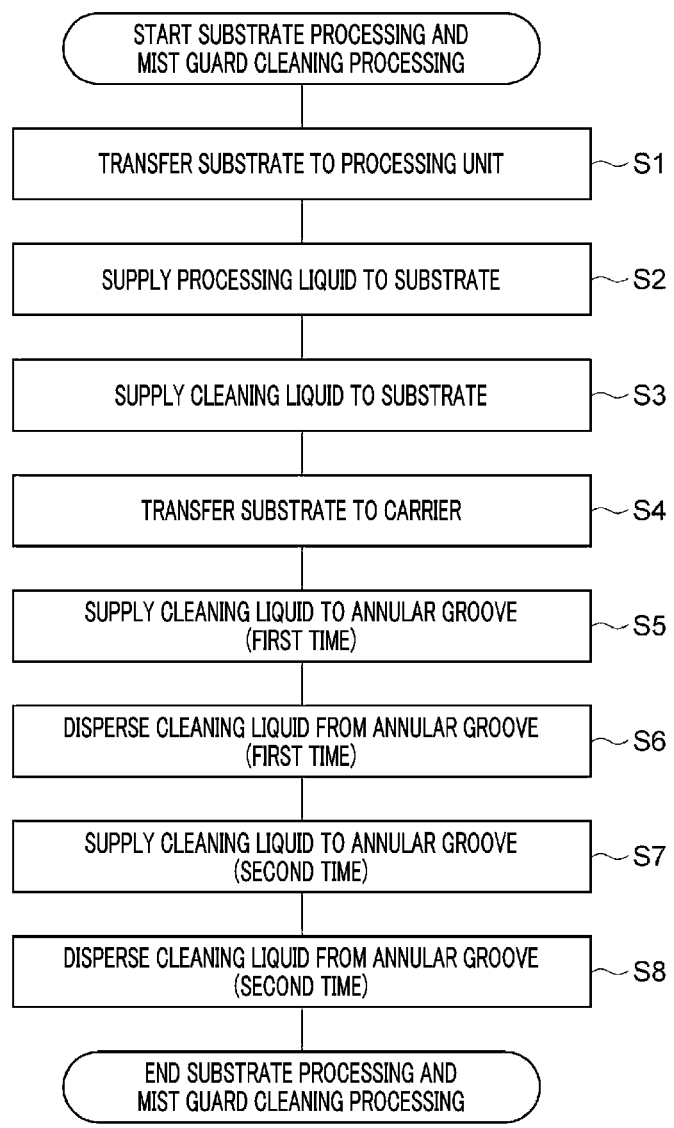
FIG. 10 is a flowchart illustrating an example sequence of the substrate processing and the mist guard cleaning processing.

First, the controller Ctr controls the transfer arms A1 and A2 to take out one substrate W from the carrier 7 and transfer it into one of the processing units U (see process S1 of FIG. 10). The substrate W transferred into the processing unit U is placed on the plurality of supporting pins 44 in the state that the mist guard 70 is located at the lowered position, as illustrated in FIG. 2. At this time, the blower fan 20 is controlled by the controller Ctr to create a downflow in the chamber 10. Further, as illustrated in FIG. 2, any one of the liquids L1 to L3 may be stored in the cleaning cup 60 by the upper storage unit 80 (supplies 81 to 83) as the cleaning liquid. In this case, at least the lower portion of the cylindrical portion 71 of the mist guard 70 is immersed in the cleaning liquid.

Figure 5:
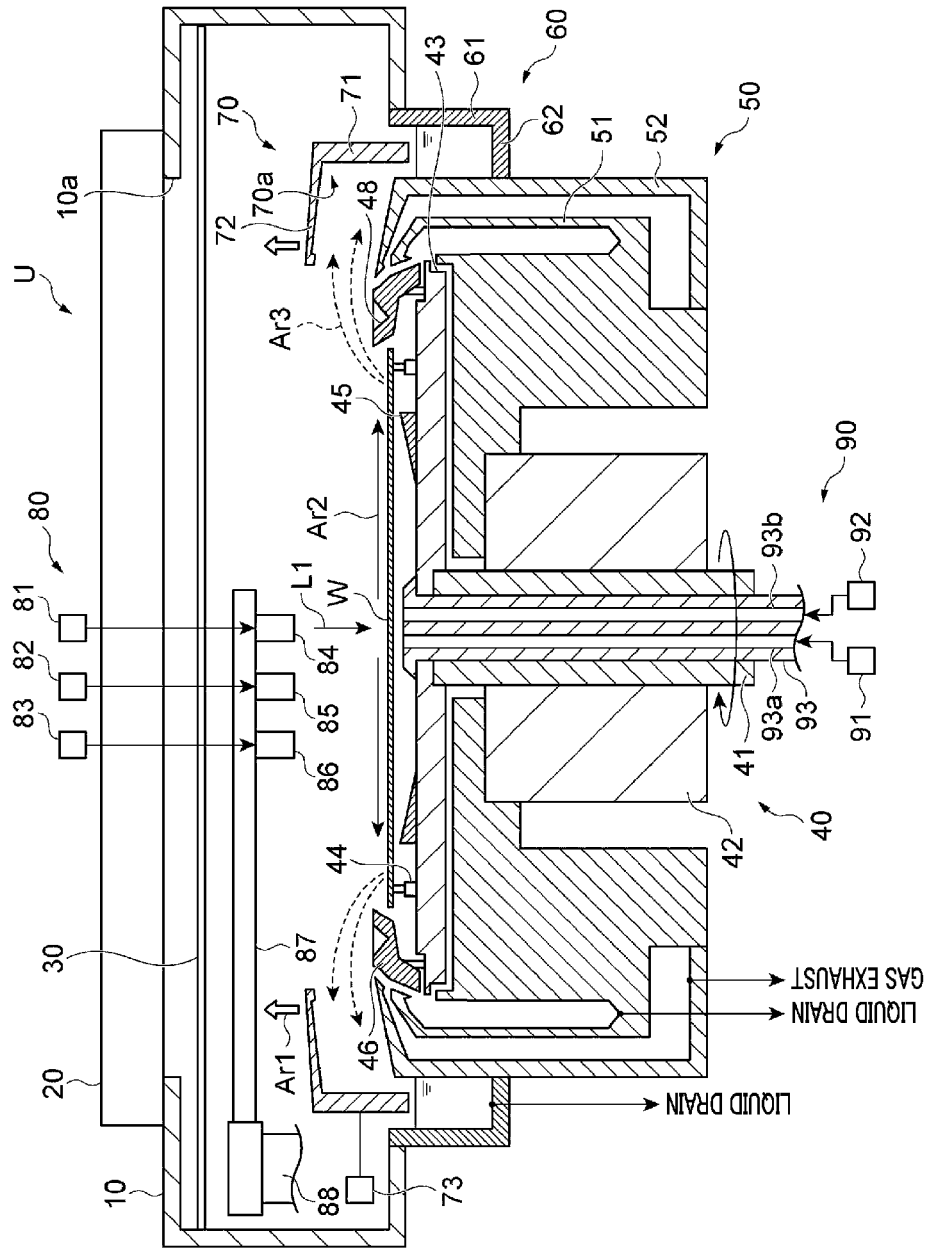
FIG. 5 is a diagram for describing an example of a sequence of a substrate processing and a mist guard cleaning processing.

Subsequently, the controller Ctr controls the driving unit 73 to move the mist guard 70 to the raised position (see arrow Ar1 of FIG. 5). In this state, the controller Ctr controls the driving unit 42 to rotate the rotation shaft 41, the supporting plate 43, the plurality of supporting pins 44, the annular member 45, the inner cup body 46, and so forth (hereinafter referred to as a rotation unit together), thus allowing the substrate W supported by the plurality of supporting pins 44 to be rotated. In addition, the controller Ctr controls the driving unit 88 to horizontally move the arm 87 so that the nozzle 84 or the nozzle 85 is positioned above a central portion of the substrate W. In the example of FIG. 5, the nozzle 84 is located above the central portion of the substrate W.

Then, the controller Ctr controls the supply 81 or the supply 82 to supply the liquid L1 or liquid L2 as a processing liquid from the nozzle 84 or the nozzle 85 to the central portion of the substrate W (see process S2 of FIG. 10). In the example of FIG. 5, the liquid L1 is supplied to the central portion of the substrate W. The liquid L1 or liquid L2 supplied onto the surface of the substrate W is flown toward an edge of the substrate W by a centrifugal force generated when the substrate W is rotated, while processing the surface of the substrate W (see arrow Art of FIG. 5). Most of the liquid L1 or liquid L2 scattered from the edge of the substrate W passes through the gap between the inner cup body 46 and the supporting plate 43 and is recovered by the drain cup 51. On the other hand, some of the liquid L1 or liquid L2 scatters around the substrate W to become mist, and adheres to the inner peripheral surface 70a of the mist guard 70 placed at the raised position (see arrow Ar3 of FIG. 5).

Thereafter, in the same sequence as in the process S2, the liquid L3 as a cleaning liquid is supplied from the nozzle 86 toward the central portion of the substrate W (see process S3 in FIG. 10). Accordingly, residues on the surface of the substrate W and the liquids L1 and L2 are washed away by the liquid L3. In this way, the processing of the substrate W is completed. Next, the controller Ctr controls the driving unit 73 to move the mist guard 70 to the lowered position. In this state, the controller Ctr controls the transfer arms A1 and A2 to transfer the processed substrate W from the processing unit U to the carrier 7 (see process S4 in FIG. 10). At this time, the same as in the process S1, at least the lower portion of the cylindrical portion 71 of the mist guard 70 may be immersed in the cleaning liquid. Alternatively, the cleaning liquid may not be stored in the cleaning cup 60 in the process S1, and the cleaning liquid may be supplied into the cleaning cup 60 by the upper supply unit 80 (supplies 81 to 83) at the time of the process S4, allowing at least the lower portion of the cylindrical portion 71 of the mist guard 70 to be immersed in cleaning liquid.

Figure 6:
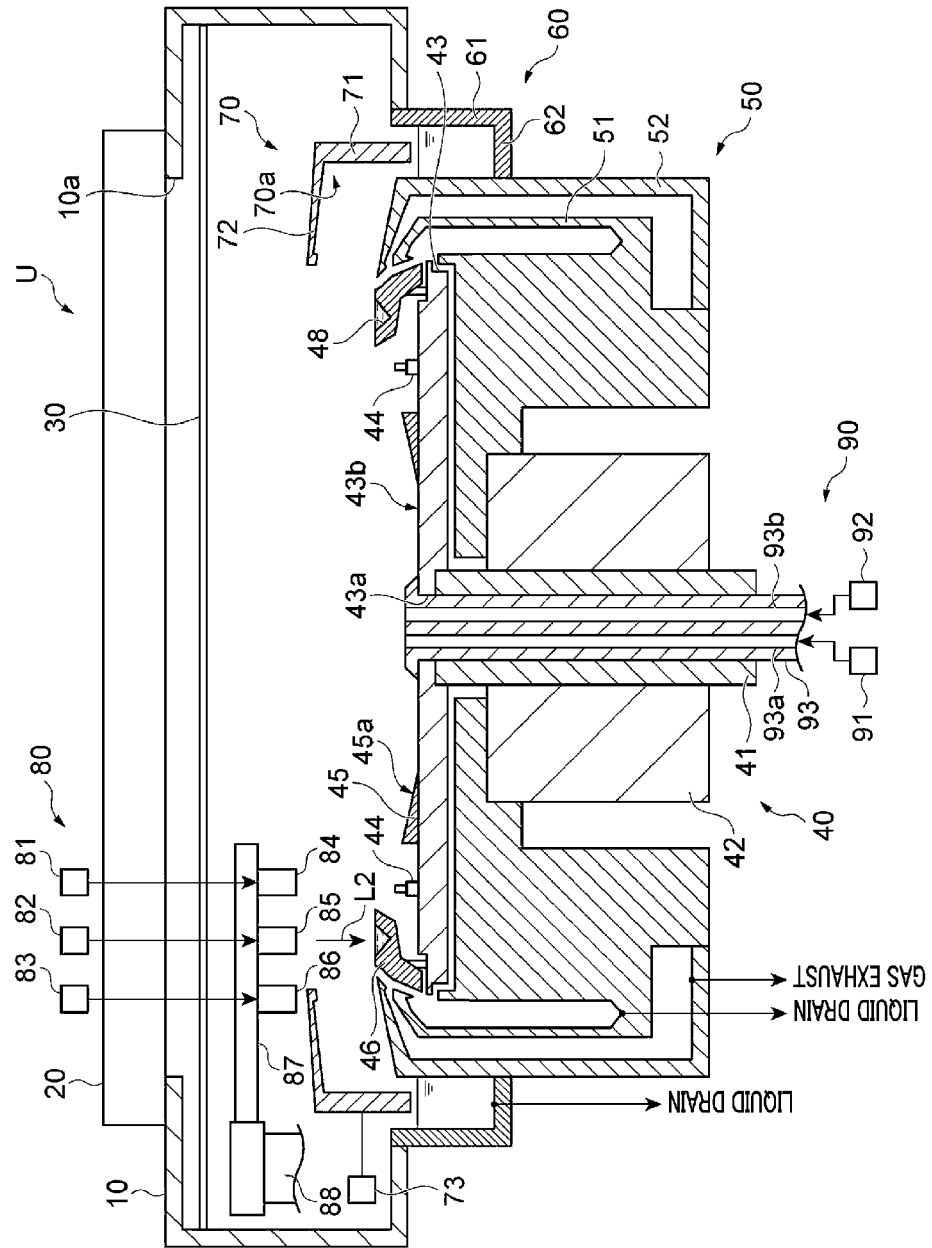
FIG. 6 is a diagram for describing an example of a processing subsequent to that of FIG. 5.

Afterwards, as illustrated in FIG. 6, the controller Ctr controls the driving unit 42 to stop the rotation of the rotation unit. Then, the controller Ctr controls the driving unit 88 to move the arm 87 horizontally so that any one of the nozzles 84 to 86 is positioned above the annular groove 48 of the inner cup body 46. In this state, the controller Ctr controls any one of the supplies 81 to 83 to supply any one of the liquids L1 to L3 from any one of the nozzles 84 to 86 to the annular groove 48 as a cleaning liquid (see process S5 of FIG. 10). In the example of FIG. 6, the liquid L2 is supplied to the annular groove 48. Accordingly, the cleaning liquid (one of the liquids L1 to L3) is stored in the annular groove 48. If the cleaning liquid is stored in the annular groove 48, the controller Ctr controls any one of the supplies 81 to 83 to stop the supply of the cleaning liquid from any one of the nozzles 84 to 86.

Figure 7:
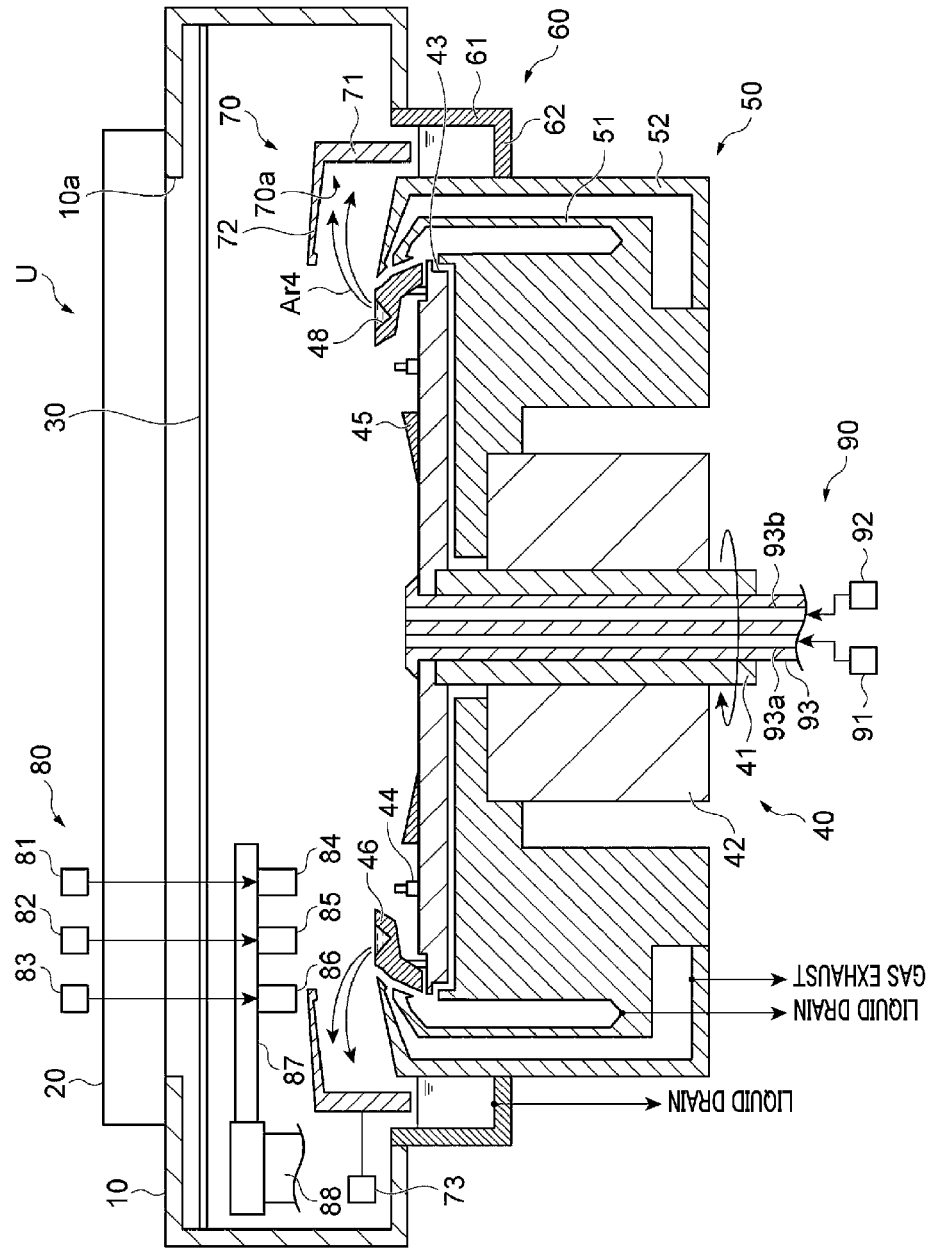
FIG. 7 is a diagram for describing an example of a processing subsequent to that of FIG. 6.

Subsequently, as shown in FIG. 7, the controller Ctr controls the driving unit 42 to rotate the rotation unit. A rotation speed at this time may be, for example, about 100 rpm to 1000 rpm. As a result, the cleaning liquid stored in the annular groove 48 is dispersed all at once from the annular groove 48 to the entire inner peripheral surface 70a of the mist guard 70 (see process S6 in FIG. 10 and arrow Ar4 in FIG. 7). Further, depending on the degree of the mist adhering to the inner peripheral surface 70a of the mist guard 70, the processes S5 and S6 may be repeated multiple times (for example, about 5 times to 10 times).

Figure 8:
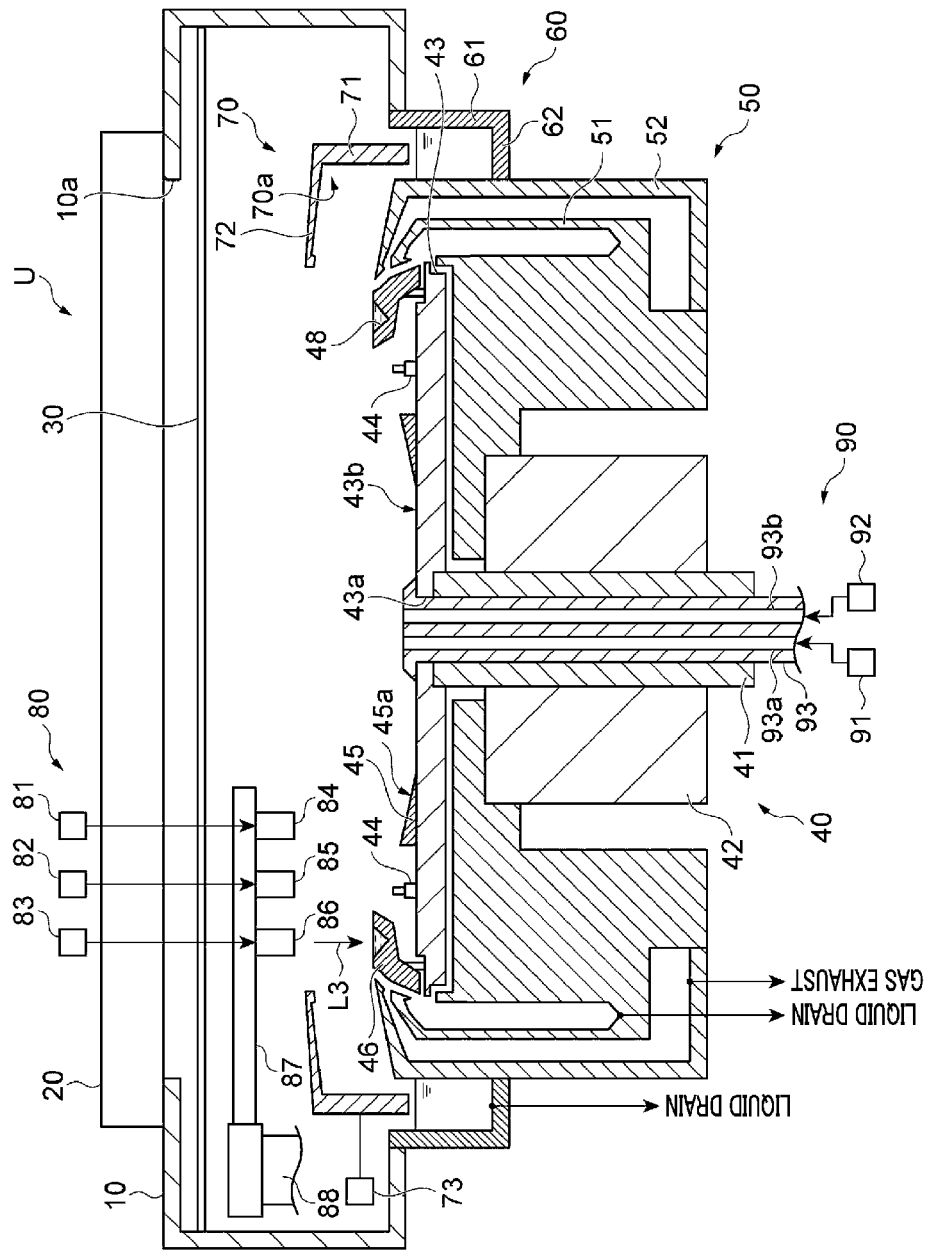
FIG. 8 is a diagram for describing an example of a processing subsequent to that of FIG. 7.

Then, as depicted in FIG. 8, the controller Ctr controls the driving unit 42 to stop the rotation of the rotation unit. Next, the controller Ctr controls the driving unit 88 to horizontally move the arm 87 so that any one of the nozzles 84 to 86 is positioned above the annular groove 48 of the inner cup body 46. In this state, the controller Ctr controls any one of the supplies 81 to 83 to supply any one of the liquids L1 to L3 from any one of the nozzles 84 to 86 to the annular groove 48 as a cleaning liquid (see process S7 of FIG. 10). Here, as the cleaning liquid supplied to the annular groove 48, one different from the liquid in the process S5 is selected. In the example of FIG. 8, the liquid L3 different from the liquid L2 supplied in the example of FIG. 6 is supplied to the annular groove 48. In this way, the cleaning liquid (one of the liquids L1 to L3) is stored in the annular groove 48. If the cleaning liquid is stored in the annular groove 48, the controller Ctr controls any one of the supplies 81 to 83 to stop the supply of the cleaning liquid from any one of the nozzles 84 to 86.

Figure 9:
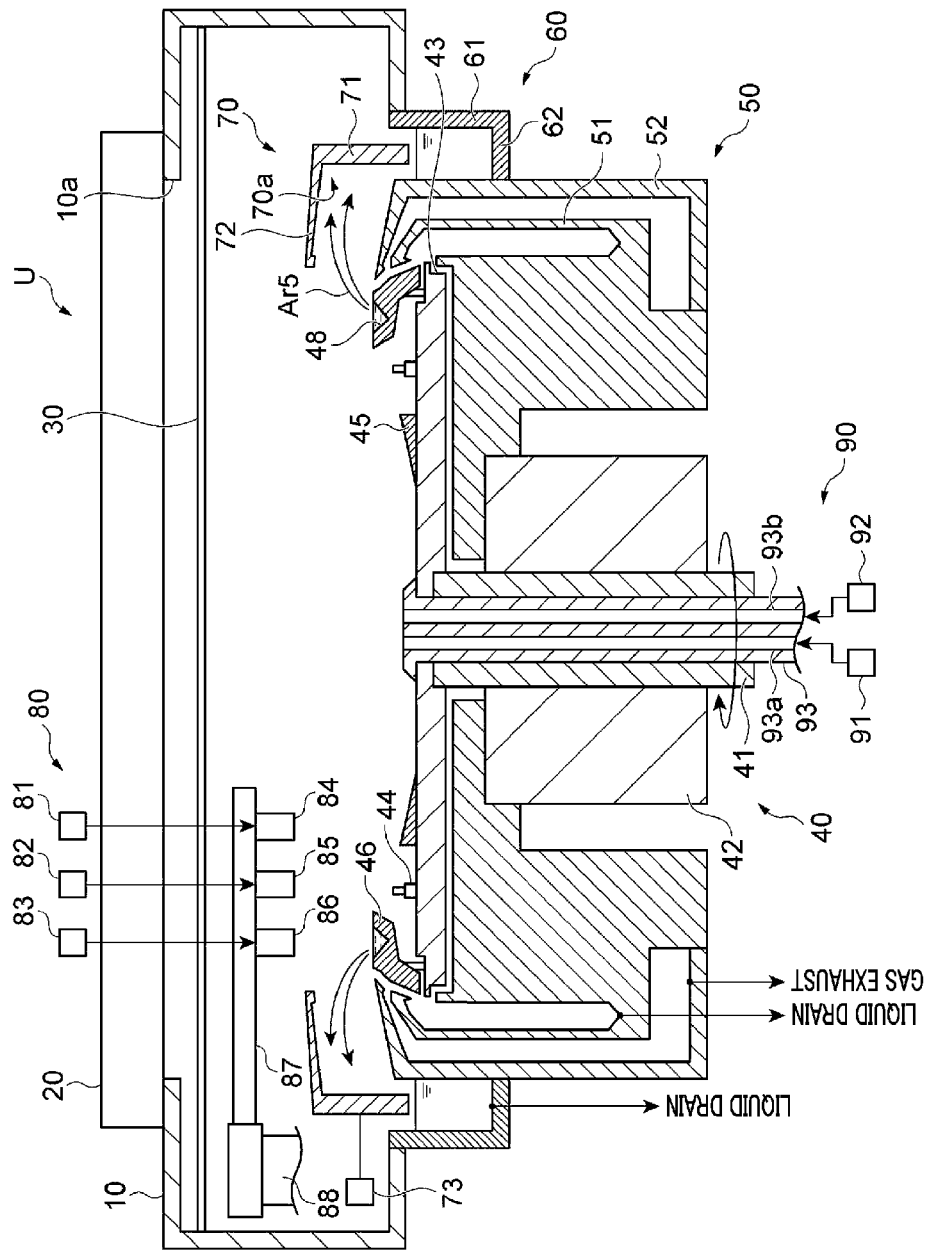
FIG. 9 is a diagram for describing an example of a processing subsequent to that of FIG. 8.

Thereafter, as illustrated in FIG. 9, the controller Ctr controls the driving unit 42 to rotate the rotation unit. The rotation speed at this time may be, for example, about 100 rpm to 1000 rpm. Accordingly, the cleaning liquid stored in the annular groove 48 is dispersed all at once from the annular groove 48 to the entire inner peripheral surface 70a of the mist guard 70 (process S8 in FIG. 10 and arrow Ar5 in FIG. 9). Through the above-described operations, the cleaning of the inner peripheral surface 70a of the mist guard 70 is completed. In addition, depending on the degree of the mist adhering to the inner peripheral surface 70a of the mist guard 70 or the degree of the cleaning liquid adhering to the inner peripheral surface 70a of the mist guard 70 in the process S6, the processes S7 and S8 may be performed multiple times (for example, about 5 times to 10 times).

(Effects)

According to the above-described example (first example), the entire inner peripheral surface 70*a* of the mist guard 70 to which the mist of the processing liquid adheres is cleaned by the cleaning liquid. Thus, it becomes possible to clean the entire inner peripheral surface 70*a* of the mist guard 70 effectively.

According to the above-described example (first example), along with the rotation of the inner cup body 46, the cleaning liquid stored in the annular groove 48 is dispersed all at once toward the entire inner peripheral surface 70*a* of the mist guard 70. Thus, it becomes possible to effectively clean the entire inner peripheral surface 70*a* of the mist guard 70 in a very short time. Therefore, productivity may be raised.

According to the above-described example (first example), since the cleaning liquid stored in the annular groove 48 flows along the inclined surface 48*a* as the inner cup body 46 is rotated, it becomes easy for the cleaning liquid to reach the mist guard 70. Therefore, the entire inner peripheral surface 70*a* of the mist guard 70 may be cleaned more effectively.

According to the above-described example (first example), at least the lower portion of the mist guard 70 can be cleaned by the cleaning liquid in the cleaning cup 60. Thus, it becomes possible to more effectively clean the lower portion of the mist guard 70 to which the mist may easily adhere.

According to the above-described example (first example), after at least the lower portion of the mist guard 70 is immersed in the cleaning liquid in the cleaning cup 60 in the process S1 and/or the process S4, the cleaning liquid can be supplied toward the entire inner peripheral surface 70*a* of the mist guard 70 in the processes S6 and S8. Typically, since the degree of cleanliness of the cleaning liquid supplied in the processes S6 and S8 is higher than the degree of cleanliness of the cleaning liquid stored in the cleaning cup 60, it becomes possible to further purify the inner peripheral surface 70*a* of the mist guard 70 after being cleaned by performing the processing according to the above-described sequence.

According to the above-described example (first example), the mist guard 70 may be cleaned by the multiple kinds of cleaning liquids. Thus, it becomes possible to further purify the inner peripheral surface 70*a* of the mist guard 70 after being cleaned.

According to the above-described example (first example), water may be supplied to the mist guard 70 at the end. Thus, the acidic chemical liquid or alkaline chemical liquid previously supplied to the mist guard 70 is washed away by the water. Therefore, it becomes possible to further purify the inner peripheral surface 70*a* of the mist guard 70 after being cleaned.

MODIFICATION EXAMPLES

It should be noted that the disclosure in the present specification is illustrative only and is not intended to be any way limiting. Various omissions, replacements and modifications may be made without departing from the spirit or scope of the claims.

Figure 11:
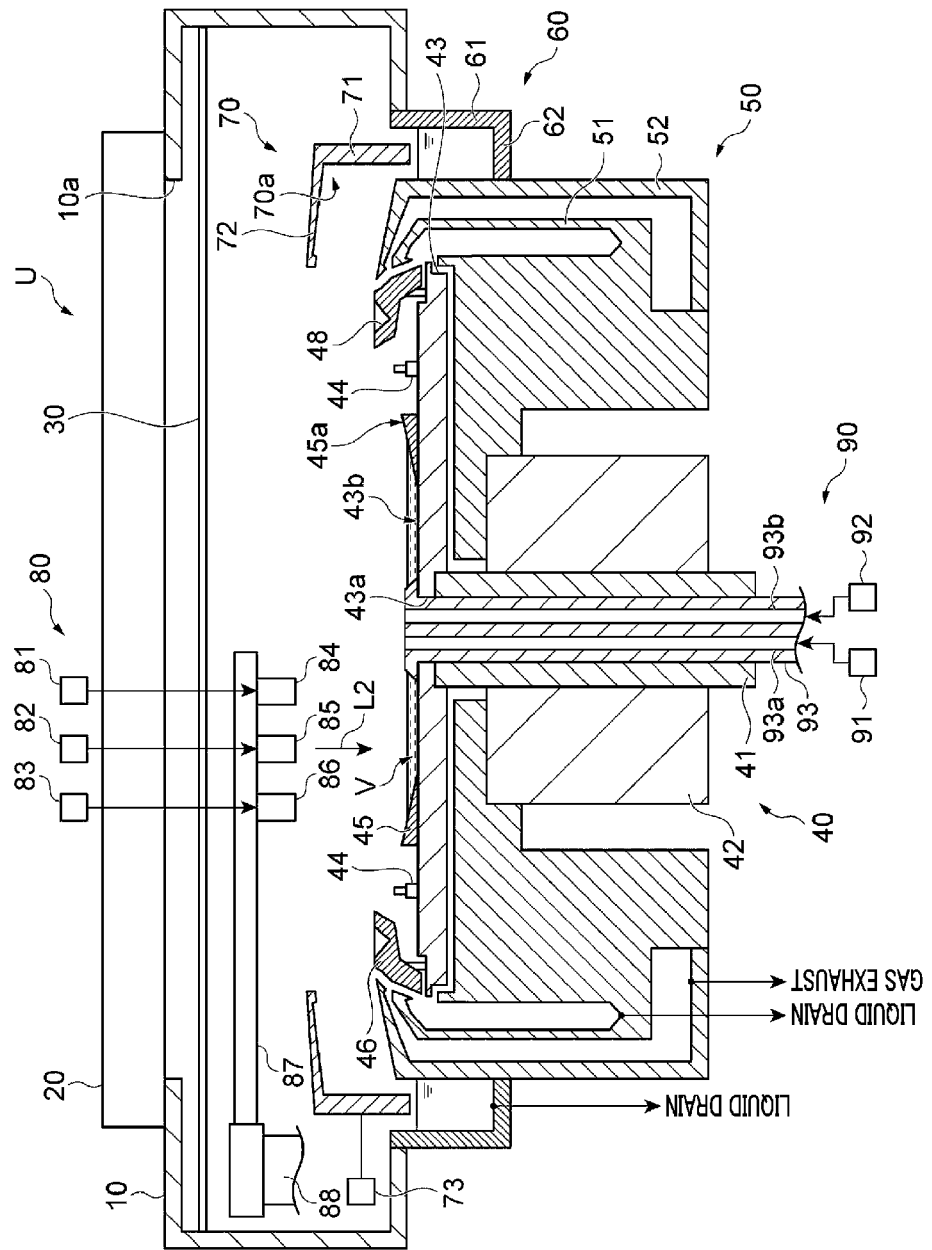
FIG. 11 is a diagram for describing an example sequence of the mist guard cleaning processing in another example (second example) of the processing unit.
Figure 12:
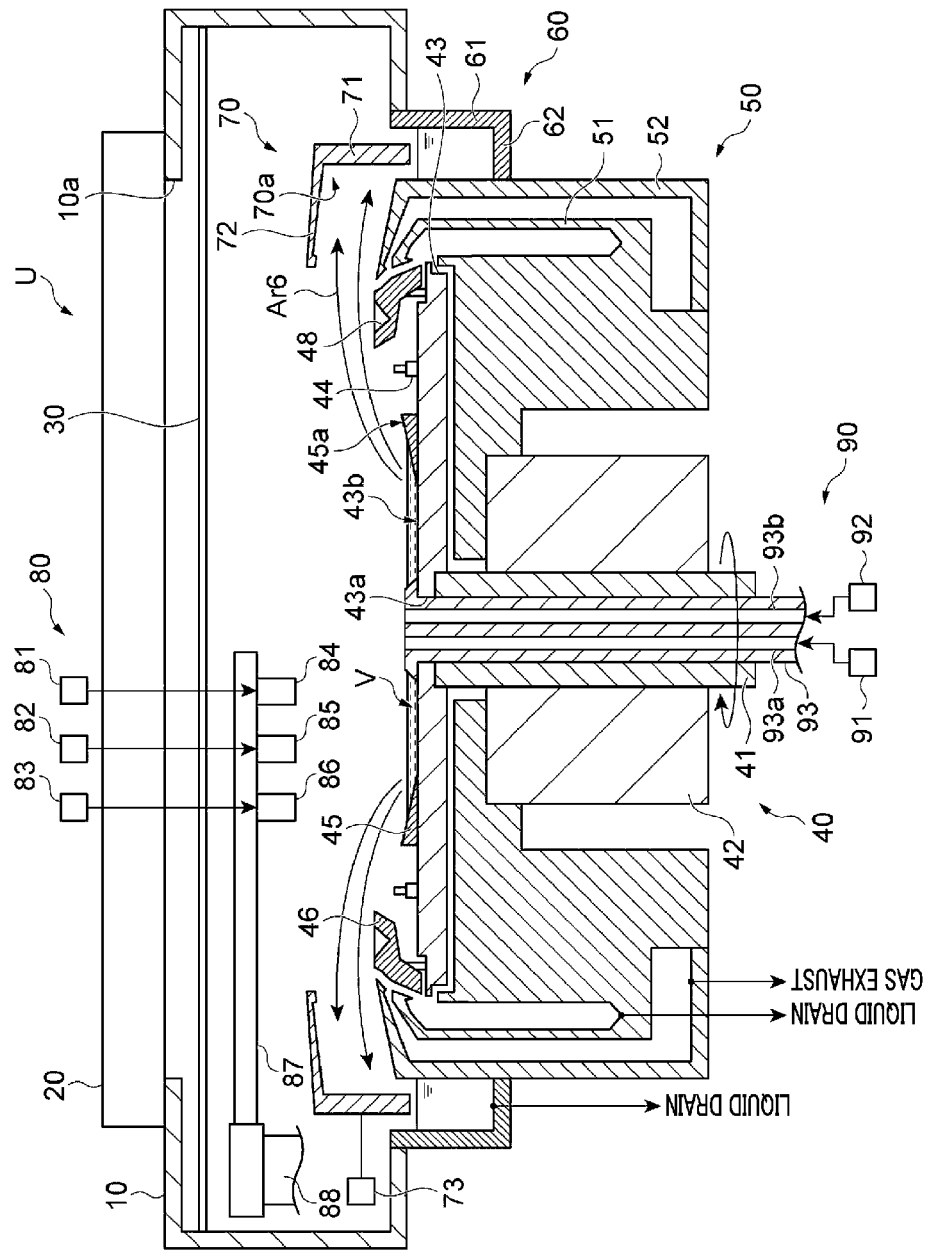
FIG. 12 is a diagram for describing an example of a processing subsequent to that of FIG. 11.

(1) In an example (second example) shown in FIG. 11 and FIG. 12, the following processing is performed instead of the processes S5 to S8 in the first example. That is, in the state that the rotation of the rotation unit is stopped, the controller Ctr controls the driving unit 88 to horizontally move the arm 87 so that any one of the nozzles 84 to 86 is located above storage space V (the space surrounded by the annular member 45 and the top surface 43*b* of the supporting plate 43). In this state, the controller Ctr controls any one of the supplies 81 to 83 to supply any one of the liquids L1 to L3 from any one of the nozzles 84 to 86 to the storage space V as a cleaning liquid. In the example of FIG. 11, the liquid L2 is supplied to the storage space V. Accordingly, the cleaning liquid (one of the liquids L1 to L3) is stored in the storage space V. If the cleaning liquid is stored in the storage space V, the controller Ctr controls any one of the supplies 81 to 83 to stop the supply of the cleaning liquid from any one of the nozzles 84 to 86.

Then, as depicted in FIG. 12, the controller Ctr controls the driving unit 42 to rotate the rotation unit. The rotation speed at this time may be, for example, about 100 rpm to about 1000 rpm. As a result, the cleaning liquid stored in the storage space V is dispersed all at once from the storage space V to the entire inner peripheral surface 70*a* of the mist guard 70 (see arrow Ar6 of FIG. 12). Thereafter, although not shown, the same as in the processes S7 and S8, a different kind of cleaning liquid may be stored in the storage space V again, and, then, the rotation unit may be rotated to disperse this cleaning liquid to the entire peripheral surface 70*a* of the mist guard 70 from the storage space V all at once.

According to the above-described example (second example), along with the rotation of the inner cup body 46, the cleaning liquid stored in the storage space V is dispersed all at once toward the entire inner peripheral surface 70*a* of the mist guard 70. Therefore, it becomes possible to effectively clean the entire inner peripheral surface 70*a* of the mist guard 70 in a very short time. As a consequence, productivity may be improved.

According to the above-described example (second example), since the cleaning liquid stored in the storage space V flows along the inclined surface 45*a* when the inner cup body 46 is rotated, the cleaning liquid may easily reach the mist guard 70. Therefore, it becomes possible to clean the entire inner peripheral surface 70*a* of the mist guard 70 more effectively.

In addition, the first example (cleaning the mist guard 70 with the cleaning liquid stored in the annular groove 48) and the second example (cleaning the mist guard 70 with the cleaning liquid stored in the storage space V) may be combined.

Figure 13:
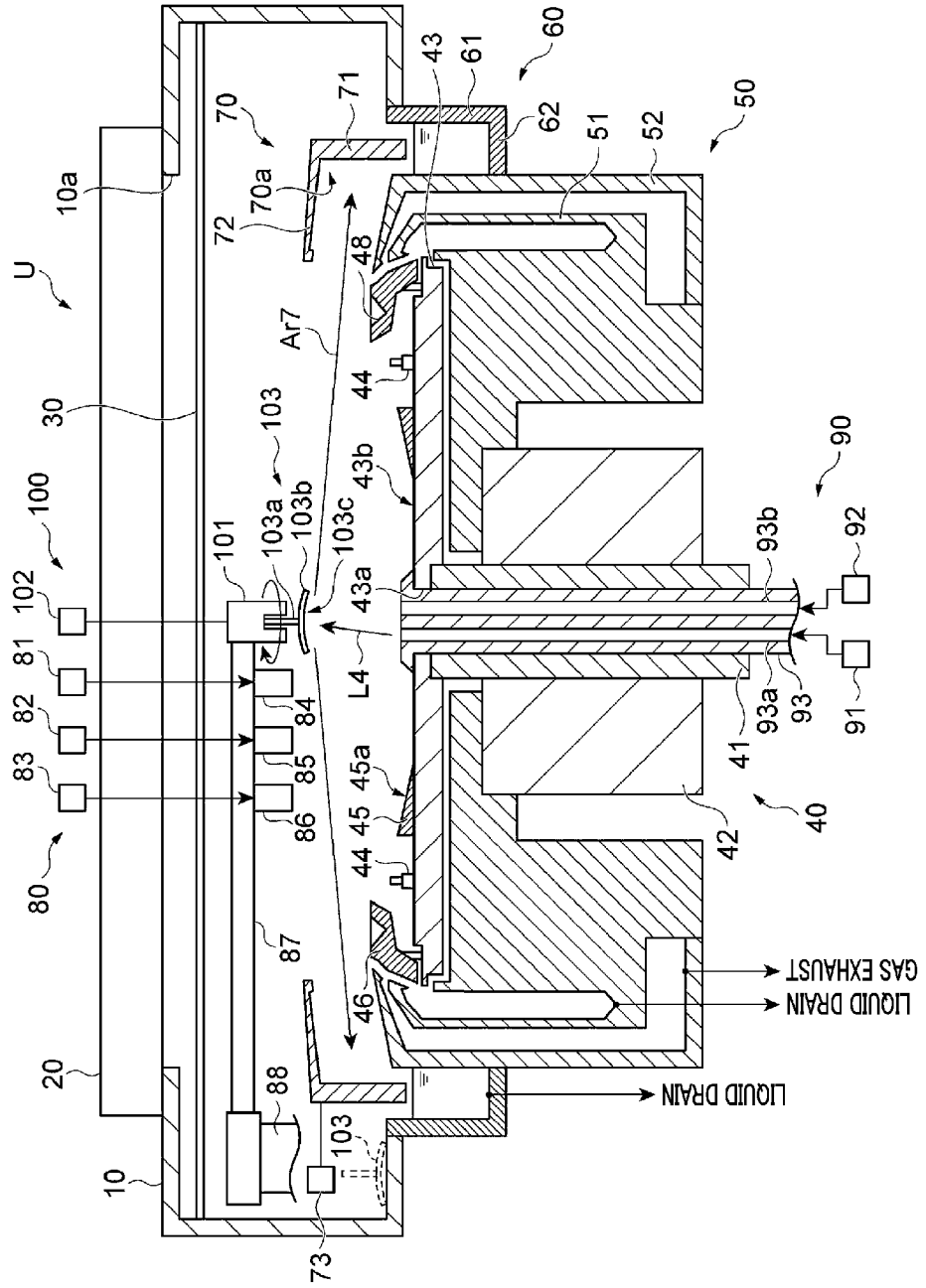
FIG. 13 is a diagram for describing an example sequence of the mist guard cleaning processing in yet another example (third example) of the processing unit.
Figure 14:
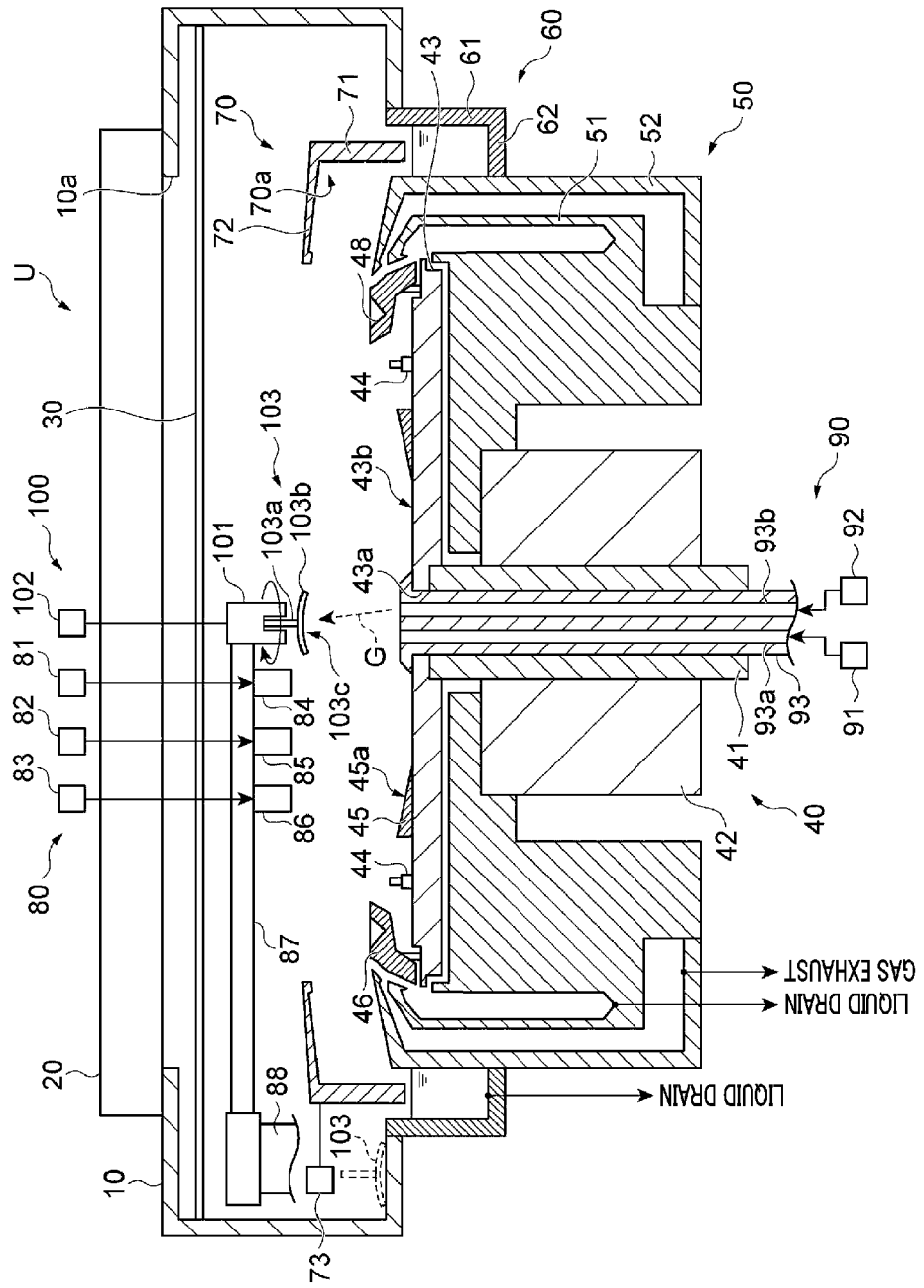
FIG. 14 is a diagram for describing an example of a processing subsequent to that of FIG. 13.

(2) The processing unit U in an example (third example) shown in FIG. 13 and FIG. 14 may further include a liquid diffusion unit 100, as compared to the first example. The liquid diffusion unit 100 includes a holding tool 101 (holding arm), a driving unit 102 (additional driving unit), and a diffusing member 103.

The holding tool 101 is provided at the arm 87 and is configured to detachably hold the diffusing member 103. That is, the diffusing member 103 is detachably mounted to the arm 87 with the holding tool 101 therebetween. The holding tool 101 may be, by way of non-limiting example, an air chuck using a negative pressure, a magnet chuck using an electromagnet or a permanent magnet, a mechanical chuck using a mechanical force (gripping force) by a holding claw or the like.

The driving unit 102 is configured to rotate the holding tool 101 or the diffusing member 103 about a rotation axis extending in the vertical direction. The diffusing member 103 is configured to be movable above the rotating/holding unit 40 by the driving unit 88 in the state that it is held by the holding tool 101. The diffusing member 103 may be positioned above the nozzle 93, as shown in FIG. 13 and FIG. 14. The diffusing member 103 includes a base portion 103a detachably mounted to the holding tool 101; and a diffusing portion 103b provided at an end of the base portion 103a.

The diffusing portion 103b includes a diffusing surface 103c facing the nozzle 93 in the state that the diffusing member 103 is positioned above the nozzle 93. The diffusing surface 103c is configured to horizontally diffuse the liquid L4 supplied from the flow path 93a of the nozzle 93. The diffusing surface 103c may be formed as, for example, a flat surface, or may be formed as a concave curved surface recessed upwards in the state that the diffusing member 103 is held by the holding tool 101. When the diffusing surface 103c is a concave curved surface, the diffusing surface 103c may have a spherical surface shape.

In the processing unit U of the third example, the following processing is performed instead of the processes S5 to S8 of the first example. That is, the controller Ctr controls the driving unit 88 so that the diffusing member 103 (see a broken line in FIG. 13) disposed at a preset standby position within the chamber 10 is held by the holding tool 101. Then, the controller Ctr controls the driving unit 88 to move the diffusing member 103 to a position above the rotating/holding unit 40 so that the diffusing member 103 is positioned above the nozzle 93. At this time, the controller Ctr may control the driving unit 102 to rotate the diffusing member 103 held by the holding tool 101.

In this state, the controller Ctr controls the supply 91 to supply the liquid L4 from the flow path 93a of the nozzle 93 toward the diffusing surface 103c. The cleaning liquid supplied to the diffusing surface 103c in this way is diffused horizontally and dispersed onto the entire inner peripheral surface 70a of the mist guard 70 all at once (see arrow Ar7 in FIG. 13). Next, the controller Ctr may control the supply 92 to supply the drying gas G from the flow path 93b of the nozzle 93 toward the diffusing surface 103c. As a result, the liquid L4 adhering to the diffusing member 103 is dried. Thereafter, the controller Ctr controls the driving unit 88 to return the diffusing member 103 to the preset standby position within the chamber 10 (see a broken line in FIG. 14).

According to the above-described example (third example), the cleaning liquid having collided with the diffusing member 103 are dispersed toward the entire inner peripheral surface 70a of the mist guard 70 all at once. Accordingly, as compared to a case where the cleaning liquid is supplied to the inner peripheral surface 70a of the mist guard 70 using a nozzle or the like, it is possible to effectively clean the entire inner peripheral surface 70a of the mist guard 70 in a very short time. Therefore, productivity may be raised.

According to the above-described example (third example), the liquid L4 can be supplied to the diffusing member 103 while the diffusing member 103 is being rotated. In this case, along with the rotation of the diffusing member 103, the cleaning liquid having collided with the diffusing member 103 may be easily scattered around. Thus, it becomes possible to clean the whole inner peripheral surface 70a of the mist guard 70 more effectively.

According to the above-described example (third example), the diffusing surface 103c of the diffusing member 103 may be formed as the concave curved surface. In this case, since the cleaning liquid having collided with the diffusing member 103 flows along the diffusing surface 103c having the concave curved surface shape, the cleaning liquid may easily reach the mist guard 70. Therefore, it becomes possible to clean the whole inner peripheral surface 70a of the mist guard 70 more effectively.

According to the above-described example (third example), the diffusing member 103 is configured to be detachable, and when the cleaning of the inner peripheral surface 70a of the mist guard 70 is not performed, the diffusing member 103 may be placed at the standby position within the chamber 10. In this case, by keeping the diffusing member at the standby position when it is not in use, it is possible to suppress a situation in which the cleaning liquid adhering to the diffusing member 103 falls down onto a substrate W carried into the processing unit U afterwards.

According to the above-described example (third example), the diffusing member 103 may be dried by the drying gas G. In this case, the situation in which the cleaning liquid adhering to the diffusing member 103 falls onto the substrate W carried into the processing unit U afterwards can be more reliably suppressed.

Further, in the above-described example (third example), the diffusing member 103 may be fixed to the arm 87. Alternatively, the diffusing member 103 may be detachably attached or fixed to an arm different from the arm 87 at which the nozzles 84 to 86 are provided. Still alternatively, the diffusing member 103 may be fixed to the chamber 10 so as to be always positioned above the nozzle 93. It may be possible to combine at least one of the first example (cleaning the mist guard 70 with the cleaning liquid stored in the annular groove 48) and the second example (cleaning the mist guard 70 with the cleaning liquid stored in the storage space V) with the third example (cleaning the mist guard 70 through the diffusion of the cleaning liquid by the diffusing member 103). The cleaning liquid scattered around after colliding with the diffusing member 103 may be stored in the annular groove 48, and the rotation unit may be rotated as in the first example, thus allowing the cleaning liquid within the annular groove 48 to be dispersed all at once to the inner peripheral surface 70a of the mist guard 70.

Figure 15:
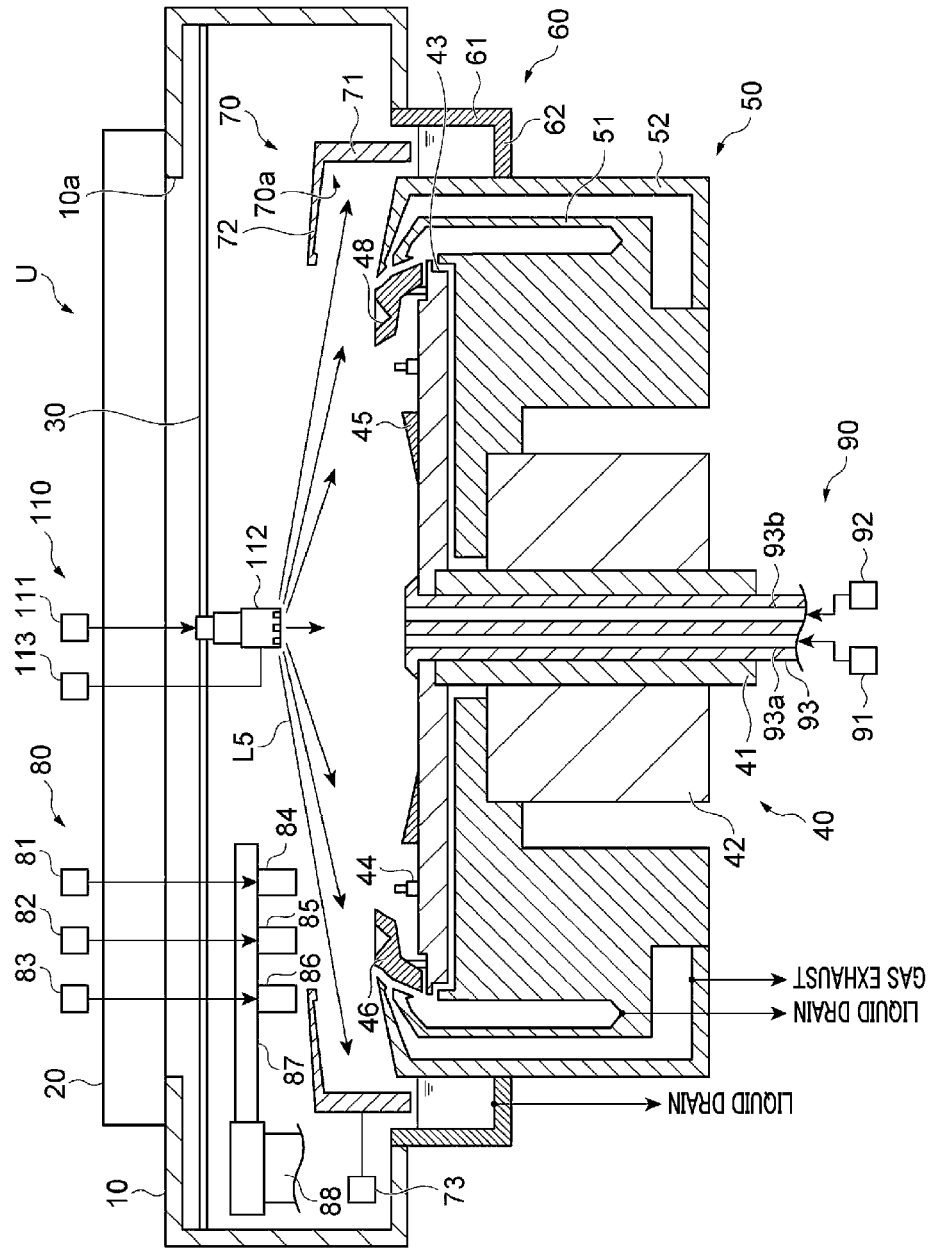
FIG. 15 is a diagram for describing an example sequence of the mist guard cleaning processing in still yet another example (fourth example) of the processing unit.

(3) The processing unit U of an example (fourth example) shown in FIG. 15 may further include a liquid supply 110, as compared to the first example. The liquid supply 110 includes a supply 111, a discharge nozzle 112, and a driving unit 113. The supply 111 is equipped with a liquid source, a valve, a pump, and so forth (not shown), and is configured to supply a liquid L5 from the discharge nozzle 112 based on a signal from the controller Ctr. The liquid L5 may be any of the above-described liquids L1 to L3.

The discharge nozzle 112 has a plurality of discharge opening opened on a circumferential surface thereof, and is configured to radially discharge the cleaning liquid supplied from the supply 111 from the plurality of discharge openings to the vicinity thereof. The discharge nozzle 112 is disposed above the rotating/holding unit 40. The discharge nozzle 112 may be fixed to the chamber 10 so that it may be always located above the rotating/holding 40, as illustrated in FIG. 15. The discharge nozzle 112 may be fixed to the arm 87 or an arm different from the arm 87, or may be detachably mounted thereto.

The driving unit 113 may be configured to drive the discharge nozzle 112 so that the positions of the plurality of discharge openings of the discharge nozzle 112 are displaced in the vertical direction. For example, as illustrated in FIG. 15, the discharge nozzle 112 has a retractable structure in which the body thereof is assembled to be accommodated inside, and when the driving unit 113 advances and retreats the body, the height position of the plurality of discharge openings may be changed. Alternatively, the driving unit 113 may move the discharge nozzle 112 itself up and down to thereby change the height position of the plurality of discharge openings.

According to the above-described example (fourth example), the cleaning liquid radially discharged from the discharge nozzle 112 to the vicinity thereof is scattered toward the entire inner peripheral surface 70a of the mist guard 70 all at once. Therefore, it becomes possible to effectively clean the entire inner peripheral surface 70a of the mist guard 70 in a very short time. Thus, productivity may be enhanced.

According to the above-described example (fourth example), it is possible to change a height position at which the cleaning liquid radially discharged from the discharge nozzle 112 reaches the inner peripheral surface 70a of the mist guard 70. Thus, the cleaning liquid can be supplied to the inner peripheral surface 70a of the mist guard 70 in a wider range. Therefore, it becomes possible to clean the inner peripheral surface 70a of the mist guard 70 more effectively.

Figure 16:
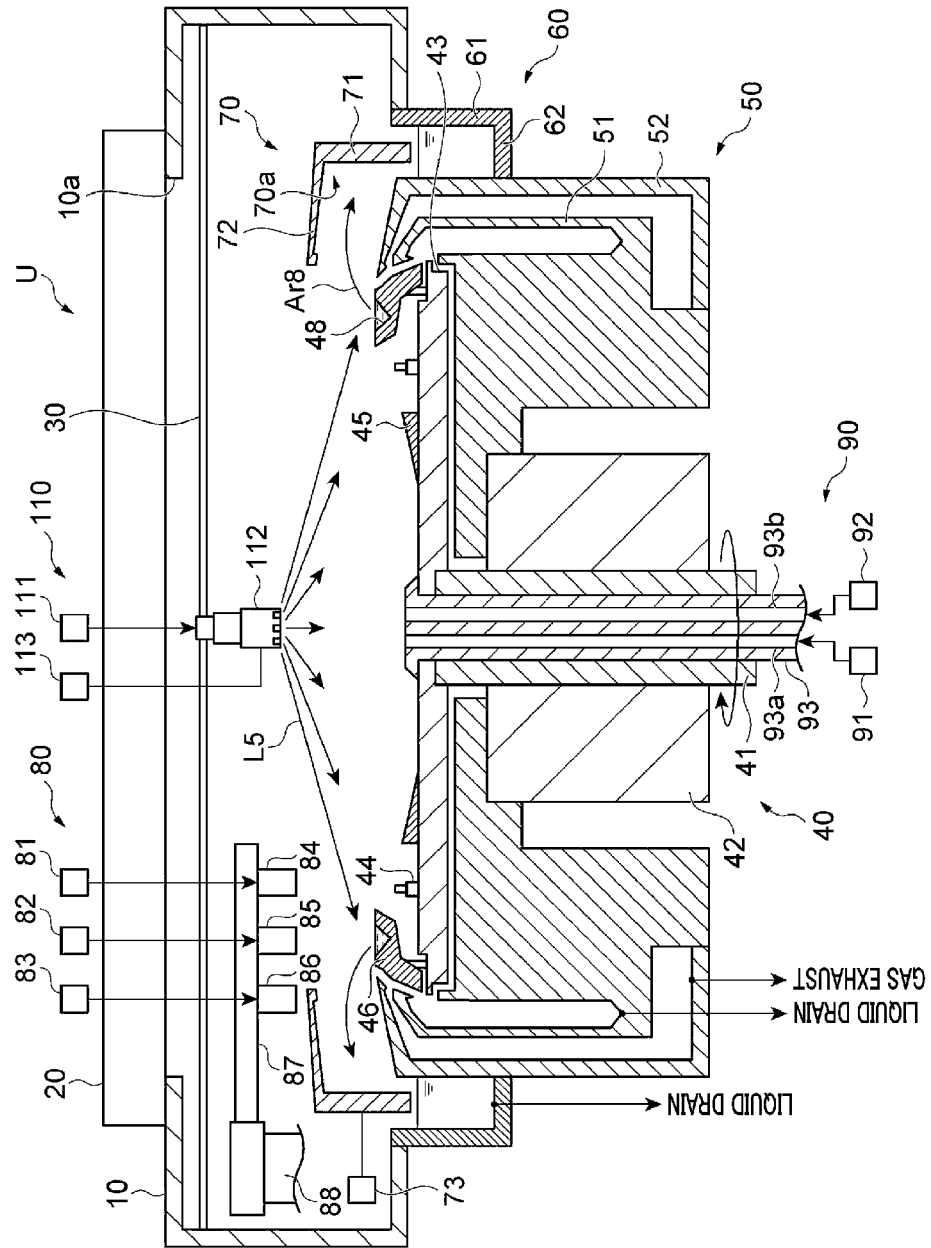
FIG. 16 is a diagram for describing an example sequence of the mist guard cleaning processing in still yet another example (fifth example) of the processing unit.

Further, it may be possible to combine at least one of the first example (cleaning the mist guard 70 with the cleaning liquid stored in the annular groove 48), the second example (cleaning the mist guard 70 with the cleaning liquid stored in the storage space V) and the third example (cleaning the mist guard 70 through the diffusion of the cleaning liquid by the diffusing member 103) with the fourth example (cleaning the mist guard 70 by discharging the cleaning liquid radially from the discharge nozzle 112 to the vicinity thereof). Alternatively, as in an example of FIG. 16 (fifth example), the cleaning liquid discharged from the discharge nozzle 112 may be stored in the annular groove 48, and the rotation unit may be rotated as in the first example, thus allowing the cleaning liquid within the annular groove 48 to be dispersed to the entire inner peripheral surface 70a of the mist guard 70 all at once.

Figure 17:
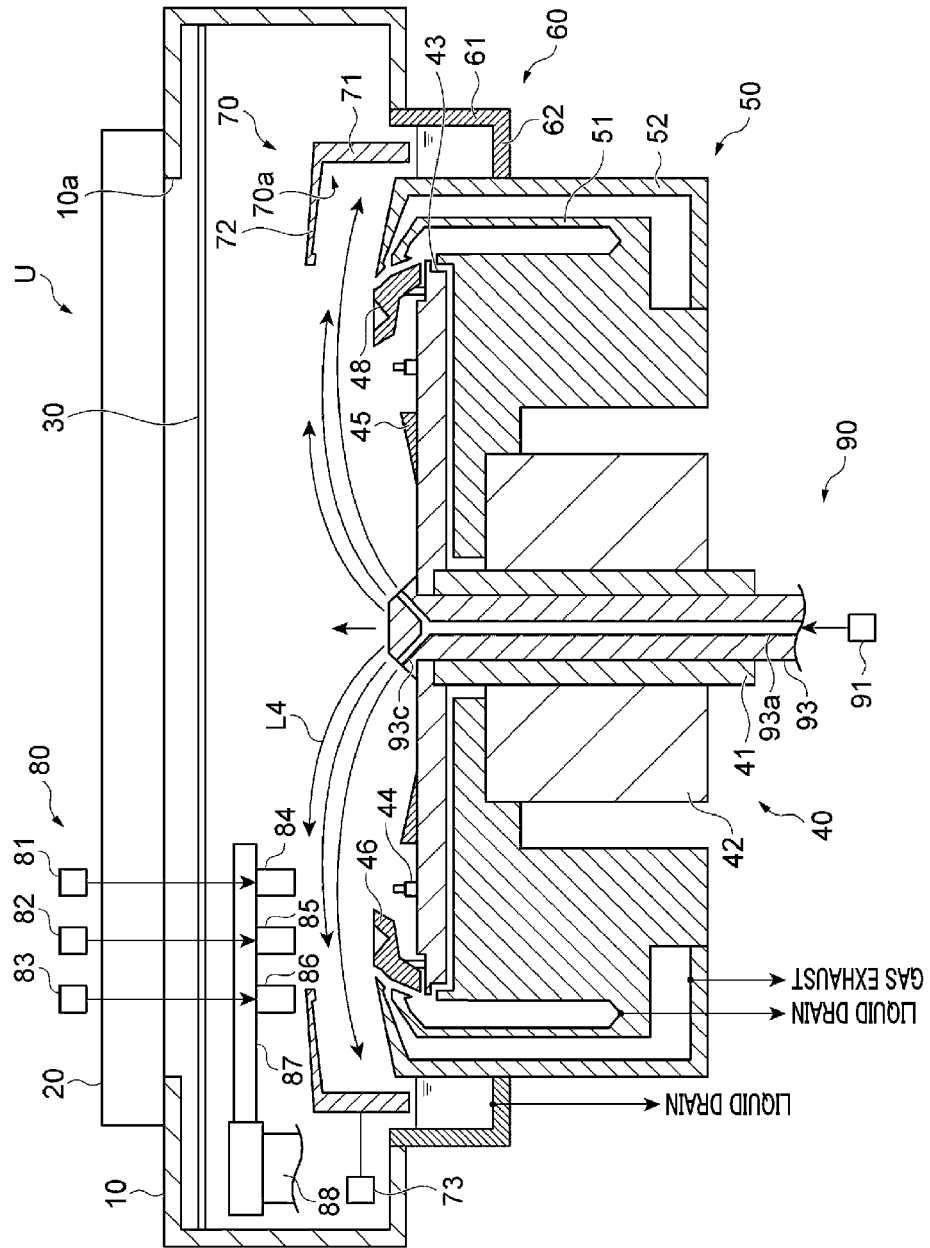
FIG. 17 is a diagram for describing an example sequence of the mist guard cleaning processing in still yet another example (sixth example) of the processing unit.

(4) In the processing unit U of an example (sixth example) shown in FIG. 17, the flow path 93a of the nozzle 93 may include a plurality of discharge openings 93c opened on a circumferential surface of an upper end of the nozzle 93, as compared to the first example. In this case, the cleaning liquid supplied from the supply 91 is radially discharged from the plurality of discharge openings 93c of the flow path 93a of the nozzle 93 to the vicinity thereof and dispersed toward the entire inner peripheral surface 70a of the mist guard 70 all at once. Accordingly, it becomes possible to effectively clean the entire inner peripheral surface 70a of the mist guard 70 in a very short time. Therefore, productive can be enhanced.

In addition, it may be possible to combine at least one of the first to fifth examples with the sixth example. Further, a discharge nozzle provided with a plurality of discharge openings for discharging the cleaning liquid radially to the vicinity thereof may be provided at the rotating/holding unit 40 (for example, the supporting plate 43), separately from the nozzle 93.

(5) In all of the above-described examples, a processing of immersing the mist guard 70 in the cleaning liquid within the cleaning cup 60 may be added. The timing at which the mist guard 70 is immersed in the cleaning liquid in the cleaning cup 60 is not particularly limited.

(6) In all of the above-described examples, when the cleaning liquid for cleaning the mist guard 70 is supplied, the rotation unit may be being rotated or may be stopped.

(7) In all the above-described examples, the rotating/holding unit 40 may be rotated at least when the discharge of the cleaning liquid from the discharge nozzle 112 is started and when the discharge is ended. In this case, the cleaning liquid supplied from the discharge nozzle 112 can be suppressed from remaining in the rotating/holding unit 40.

(8) In the first example, while rotating the rotation unit, the cleaning liquid may be stored in the annular groove 48. In the second example as well, while rotating the rotation unit, the cleaning liquid may be stored in the storage space V. The rotation speed at this time may be, for example, about 100 rpm to about 1000 rpm.

(9) In the fourth and fifth examples, the discharge nozzle 112 has the plurality of discharge openings opened on the circumferential surface thereof in order to discharge the cleaning liquid radially from the discharge nozzle 112 to the vicinity thereof. However, a discharge nozzle having at least one discharge opening on the circumferential surface thereof may be used. In this case, by discharging the cleaning liquid from the at least one discharge opening while rotating the discharge nozzle around a rotation axis extending in the vertical direction, the cleaning liquid can be scattered toward the entire inner peripheral surface 70a of the mist guard 70. Moreover, in this case, this discharge nozzle may be configured to be revolved (shake a neck portion thereof) about a revolving axis that extends horizontally. In this case, it becomes possible to supply the cleaning liquid to a wider range of the inner peripheral surface 70a of the mist guard 70.

(10) In all the above-described examples, one kind of cleaning liquid may be used to clean the inner peripheral surface 70a of the mist guard 70, or multiple kinds of cleaning liquids may be used to clean the inner peripheral surface 70a of the mist guard 70. When using the multiple kinds of cleaning liquids, these multiple kinds of cleaning liquids may be supplied to the mist guard 70 at the same time, or may be supplied to the mist guard 70 while being switched sequentially.

OTHER EXAMPLES

Example 1. A substrate processing apparatus includes a holder configured to hold a substrate; a driving unit configured to rotate the holder; an inner cup body provided in the holder to surround the substrate held by the holder from an outside thereof; a mist guard, surrounding the holder and the inner cup body from an outside thereof such that the holder and the inner cup body are located inside the mist guard, configured to be moved up and down; a processing liquid supply configured to supply a processing liquid to the substrate held by the holder; a cleaning liquid supply configured to supply a cleaning liquid; and a controller. The controller is configured to perform: supplying the processing liquid to the substrate from the processing liquid supply, in a state that the substrate is held by the holder and the mist guard is raised; and dispersing, after the supplying of the processing liquid, the cleaning liquid supplied from the cleaning liquid supply to an entire inner peripheral surface of the mist guard, in a state that the substrate is carried out from the holder and the mist guard is raised. However, if mist of the processing liquid remains adhering to the inner peripheral surface of the mist guard, there is a risk that the mist may be crystallized, and the crystals may drop off the mist guard and adhere to the substrate. According to Example 1, however, the entire inner peripheral surface of the mist guard to which the mist of the processing liquid adheres is cleaned by the cleaning liquid supplied from the cleaning liquid supply. Therefore, it becomes possible to clean the entire inner peripheral surface of the mist guard effectively.

Example 2. In the substrate processing apparatus of Example 1, the inner cup body may include an annular groove configured to store therein the cleaning liquid supplied from the cleaning liquid supply, and formed in a top surface of the inner cup body to extend along an entire circumference of the inner cup body, and the dispersing of the cleaning liquid may include supplying the cleaning liquid from the cleaning liquid supply to the annular groove, and rotating the inner cup body along with the holder by the driving unit to disperse the cleaning liquid stored in the annular groove to the entire inner peripheral surface of the mist guard. In this case, as the inner cup body is rotated, the cleaning liquid stored in the annular groove is scattered toward the entire inner peripheral surface of the mist guard all at once. Accordingly, it becomes possible to clean the entire inner peripheral surface of the mist guard in a very short time. Therefore, productivity may be raised.

Example 3. In the substrate processing apparatus of Example 2, an inner wall surface of the annular groove at an outer side may be an inclined surface that slopes upwards as it goes outwards in a diametrical direction. In this case, as the inner cup body is rotated, the cleaning liquid stored in the annular groove flows along the inclined surface, so that it becomes easy for the cleaning liquid to reach the mist guard. Therefore, the entire inner peripheral surface of the mist guard may be cleaned more effectively.

Example 4. In the substrate processing apparatus of any one of Examples 1 to 3, the holder may include an annular member disposed to be protruded upwards from a top surface of the holder, and the dispersing of the cleaning liquid may include supplying the cleaning liquid from the cleaning liquid supply to a storage space surrounded by the annular member and the top surface of the holder, and rotating the inner cup body along with the holder by the driving unit to disperse the cleaning liquid stored in the storage space to the entire inner peripheral surface of the mist guard. In this case, as the inner cup body is rotated, the cleaning liquid stored in the storage space is scattered toward the entire inner peripheral surface of the mist guard all at once. Accordingly, it becomes possible to clean the entire inner peripheral surface of the mist guard effectively in a very short time. Therefore, productively may be raised.

Example 5. In the substrate processing apparatus of Example 4, an inner wall surface of the annular member at an inner side may be an inclined surface that slopes upwards as it goes outwards in a diametrical direction. In this case, since the cleaning liquid stored in the storage space flows along the inclined surface as the inner cup body is rotated, the cleaning liquid may easily reach the mist guard. Thus, the entire inner peripheral surface of the mist guard may be cleaned more effectively.

Example 6. The substrate processing apparatus of Example 1 may further include a diffusing member configured to diffuse the cleaning liquid in a horizontal direction, and disposed above the holder. The cleaning liquid supply may be configured to discharge the cleaning liquid upwards through a through hole provided at the holder, and the dispersing of the cleaning liquid may include discharging the cleaning liquid from the cleaning liquid supply toward the diffusing member through the through hole, thus allowing the cleaning liquid diffused in the horizontal direction after colliding with the diffusing member to be dispersed to the entire inner peripheral surface of the mist guard. In this case, the cleaning liquid having collided with the diffusing member is dispersed toward the entire inner peripheral surface of the mist guard at once. Thus, as compared to a case where the cleaning liquid is supplied to the inner peripheral surface of the mist guard by using a nozzle or the like, it becomes possible to effectively clean the entire inner peripheral surface of the mist guard in a very short time. As a result, productivity may be improved.

Example 7. The substrate processing apparatus of Example 6 may further include an additional driving unit configured to rotate the diffusing member around a rotation axis extending in a vertical direction. The dispersing of the cleaning liquid may include discharging the cleaning liquid from the cleaning liquid supply toward the diffusing member through the through hole while rotating the diffusing member with the additional driving unit, thus allowing the cleaning liquid diffused in the horizontal direction after colliding with the diffusing member to be dispersed to the entire inner peripheral surface of the mist guard. In this case, as the diffusing member is rotated, the cleaning liquid having collided with the diffusing member may be easily scattered around. Thus, it becomes possible to clean the entire inner peripheral surface of the mist guard more effectively.

Example 8. The substrate processing apparatus of any one of Examples 1 to 5 may further include an additional cleaning liquid supply configured to discharge a cleaning liquid upwards through a through hole provided at the holder; and a diffusing member configured to diffuse the cleaning liquid supplied from the additional cleaning liquid supply in a horizontal direction, and configured to be disposed above the holder. The dispersing of the cleaning liquid may include dispersing the cleaning liquid supplied from the cleaning liquid supply to the entire inner peripheral surface of the mist guard in a state that the substrate is carried out from the holder and the mist guard is raised, and discharging the cleaning liquid from the additional cleaning liquid supply toward the diffusing member through the through hole, thus allowing the cleaning liquid diffused in the horizontal direction after colliding with the diffusing member to be dispersed to the entire inner peripheral surface of the mist guard. In this case, the same effects as in Examples 1 and 6 may be obtained.

Example 9. The substrate processing apparatus of Example 8 may further include an additional driving unit configured to rotate the diffusing member around a rotation axis extending in a vertical direction. The dispersing of the cleaning liquid may include dispersing the cleaning liquid supplied from the cleaning liquid supply to the entire inner peripheral surface of the mist guard in the state that the substrate is carried out from the holder and the mist guard is raised, and discharging the cleaning liquid from the additional cleaning liquid supply toward the diffusing member through the through hole while rotating the diffusing member by the additional driving unit, thus allowing the cleaning liquid diffused in the horizontal direction after colliding with the diffusing member to be dispersed to the entire inner peripheral surface of the mist guard. In this case, the same effects as in Example 7 may be achieved.

Example 10. In the substrate processing apparatus of any one of Examples 6 to 9, the diffusing member may include a concave curved surface recessed upwards in a state that the diffusing member is disposed above the holder. In this case, since the cleaning liquid having collided with the diffusing member flows along the concave curved surface, it becomes easy for the cleaning liquid to reach the mist guard. Therefore, the entire inner peripheral surface of the mist guard may be cleaned more effectively.

Example 11. The substrate processing apparatus of any one of Examples 6 to 10 may further include a holding arm configured to be moved above the holder. The diffusing member may be detachably mounted to the holding arm, and the controller may be configured to further perform, prior to the dispersing of the cleaning liquid, locating the diffusing member at a position above the holder by holding the diffusing member placed at a standby position at an outside of the mist guard with the holding arm. In this case, by keeping the diffusing member at the standby position when it is not in use, it becomes possible to suppress a situation in which the cleaning liquid adhering to the diffusing member falls down onto the substrate.

Example 12. The substrate processing apparatus of any one of Examples 6 to 10 may further include a gas supply configured to supply a drying gas to the diffusing member. The controller may be configured to further perform supplying the drying gas from the gas supply to the diffusing member after the dispersing of the cleaning liquid. In this case, the cleaning liquid adhering to the diffusing member is dried by the drying gas. Therefore, it becomes possible to suppress a situation in which the cleaning liquid adhering to the diffusing member falls down onto the substrate.

Example 13. In the substrate processing apparatus of any one of Examples 1 to 12, the cleaning liquid supply may include a discharge nozzle configured to radially discharge the cleaning liquid from multiple discharge openings opened on a circumferential surface thereof. In this case, the cleaning liquid discharged radially from the discharge nozzle to the vicinity thereof is scattered toward the entire inner peripheral surface of the mist guard all at once. Therefore, it becomes possible to clean the entire inner peripheral surface of the mist guard effectively in a very short time. As a consequence, productively may be enhanced.

Example 14. In the substrate processing apparatus of Example 13, the discharge nozzle may be configured such that positions of the multiple discharge openings are allowed to be moved in an up-and-down direction. In this case, a height position at which the cleaning liquid discharged radially from the discharge nozzle reaches the inner peripheral surface of the mist guard is changed. Accordingly, the cleaning liquid can be supplied to a wider range of the inner peripheral surface of the mist guard. Therefore, it becomes possible to clean the entire inner peripheral surface of the mist guard more effectively.

Example 15. The substrate processing apparatus of any one of Examples 1 to 14 may further include a cleaning cup, surrounding at least a lower portion of the mist guard from an outside thereof, configured to store the cleaning liquid therein. The controller may be configured to further perform immersing at least the lower portion of the mist guard in the cleaning liquid within the cleaning cup in a state that the mist guard is lowered. In this case, at least the lower portion of the mist guard is cleaned by the cleaning liquid in the cleaning cup. Thus, it becomes possible to more effectively clean the lower portion of the mist guard to which the mist may easily adhere.

Example 16. In the substrate processing apparatus of Example 15, the immersing of the at least the lower portion of the mist guard may be performed prior to the dispersing of the cleaning liquid. In this case, after at least the lower portion of the mist guard is cleaned with the cleaning liquid in the cleaning cup, the entire inner peripheral surface of the mist guard is cleaned by the cleaning liquid supplied from the cleaning liquid supply. Typically, the degree of cleanliness of the cleaning liquid supplied from the cleaning liquid supply is higher than the degree of cleanliness of the cleaning liquid stored in the cleaning cup. Thus, by performing the processing in the sequence as described in Example 16, it becomes possible to further purify the inner peripheral surface of the mist guard after being cleaned.

Example 17. In the substrate processing apparatus of any one of Examples 1 to 16, the cleaning liquid supplied from the cleaning liquid supply may include a first liquid and a second liquid selected from an acidic chemical liquid, an alkaline chemical liquid and water, and the dispersing of the cleaning liquid may include supplying the first liquid and the second liquid from the cleaning liquid supply while switching the first liquid and the second liquid in turn, thus allowing the first liquid and the second liquid to be sequentially dispersed to the entire inner peripheral surface of the mist guard. In this case, the mist guard is cleaned by the multiple kinds of cleaning liquids. Therefore, it becomes possible to further purify the inner peripheral surface of the mist guard after being cleaned.

Example 18. In the substrate processing apparatus of Example 17, the first liquid may be the acidic chemical liquid or the alkaline chemical liquid, and the second liquid may be water. The dispersing of the cleaning liquid may include supplying the first liquid and the second liquid from the cleaning liquid supply while switching the first liquid and the second liquid in turn, thus allowing the first liquid and the second liquid to be dispersed to the entire inner peripheral surface of the mist guard in this order. In this case, the water is supplied to the mist guard at the end. Accordingly, the acidic chemical liquid or alkaline chemical liquid previously supplied to the mist guard is washed away by the water. Therefore, it becomes possible to further purify the inner peripheral surface of the mist guard after being cleaned.

Example 19. A cleaning method of a mist guard includes supplying a processing liquid from a processing liquid supply to a substrate in a state that the substrate is held by a holder and in a state that a mist guard is raised, the mist guard surrounding the holder and an inner cup body from an outside thereof to locate the holder and the inner cup body inside the mist guard, the inner cup body being provided in the holder to surround the substrate held by the holder from an outside thereof; storing, after the supplying of the processing liquid, a cleaning liquid supplied from a cleaning liquid supply in an annular groove provided in a top surface of the inner cup body to be extended along an entire circumference of the inner cup body or in a storage space surrounded by a top surface of the holder and an annular member protruded upwards from the top surface of the holder, in a state that the substrate is carried out from the holder and the mist guard is raised; and rotating, after the storing of the cleaning liquid, the inner cup body along with the holder in a state that the mist guard is raised, thus allowing the cleaning liquid stored in the annular groove or the storage space to be dispersed to an entire inner peripheral surface of the mist guard. In this case, the same effects as in Examples 1, 2 and 4 are achieved.

Example 20. The cleaning method of the mist guard of Example 19 may further include immersing at least a lower portion of the mist guard in the cleaning liquid stored in a cleaning cup. In this case, the same effects as in Example 15 are obtained.

According to the substrate processing apparatus and the cleaning method of the mist guard of the present disclosure, it is possible to clean the entire inner peripheral surface of the mist guard effectively.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
a holder configured to hold a substrate;
a driving unit configured to rotate the holder;
an inner cup body provided in the holder to surround the substrate held by the holder from an outside thereof;
a mist guard, surrounding the holder and the inner cup body from an outside thereof such that the holder and the inner cup body are located inside the mist guard, configured to be moved up and down;
a processing liquid supply configured to supply a processing liquid to the substrate held by the holder;
a cleaning liquid supply configured to supply a cleaning liquid; and
a controller
configured to perform:
supplying the processing liquid to the substrate from the processing liquid supply, in a state that the substrate is held by the holder and the mist guard is raised; and
dispersing, after the supplying of the processing liquid, the cleaning liquid supplied from the cleaning liquid supply to an entire inner peripheral surface of the mist guard, in a state that the substrate is carried out from the holder and the mist guard is raised,
wherein the inner cup body includes an annular groove configured to store therein the cleaning liquid supplied from the cleaning liquid supply, and formed in a top surface of the inner cup body to extend along an entire circumference of the inner cup body, and
the dispersing of the cleaning liquid comprises supplying the cleaning liquid from the cleaning liquid supply to the annular groove, and rotating the inner cup body along with the holder by the driving unit to disperse the cleaning liquid stored in the annular groove to the entire inner peripheral surface of the mist guard.

2. The substrate processing apparatus of claim 1, wherein an inner wall surface of the annular groove at an outer side is an inclined surface that slopes upwards as it goes outwards in a diametrical direction.

3. The substrate processing apparatus of claim 1, wherein the holder comprises an annular member disposed to be protruded upwards from a top surface of the holder, and
the dispersing of the cleaning liquid comprises supplying the cleaning liquid from the cleaning liquid supply to a storage space surrounded by the annular member and the top surface of the holder, and rotating the inner cup body along with the holder by the driving unit to disperse the cleaning liquid stored in the storage space to the entire inner peripheral surface of the mist guard.

4. The substrate processing apparatus of claim 3, wherein an inner wall surface of the annular member at an inner side is an inclined surface that slopes upwards as it goes outwards in a diametrical direction.

5. The substrate processing apparatus of claim 1, further comprising:

a diffusing member configured to diffuse the cleaning liquid in a horizontal direction, and disposed above the holder,
wherein the cleaning liquid supply is configured to discharge the cleaning liquid upwards through a through hole provided at the holder, and
the dispersing of the cleaning liquid comprises discharging the cleaning liquid from the cleaning liquid supply toward the diffusing member through the through hole, thus allowing the cleaning liquid diffused in the horizontal direction after colliding with the diffusing member to be dispersed to the entire inner peripheral surface of the mist guard.

6. The substrate processing apparatus of claim 5, further comprising:
an additional driving unit configured to rotate the diffusing member around a rotation axis extending in a vertical direction,
wherein the dispersing of the cleaning liquid comprises discharging the cleaning liquid from the cleaning liquid supply toward the diffusing member through the through hole while rotating the diffusing member with the additional driving unit, thus allowing the cleaning liquid diffused in the horizontal direction after colliding with the diffusing member to be dispersed to the entire inner peripheral surface of the mist guard.

7. The substrate processing apparatus of claim 1, further comprising:
an additional cleaning liquid supply configured to discharge a cleaning liquid upwards through a through hole provided at the holder; and
a diffusing member configured to diffuse the cleaning liquid supplied from the additional cleaning liquid supply in a horizontal direction, and configured to be disposed above the holder,
wherein the dispersing of the cleaning liquid comprises dispersing the cleaning liquid supplied from the cleaning liquid supply to the entire inner peripheral surface of the mist guard in a state that the substrate is carried out from the holder and the mist guard is raised, and discharging the cleaning liquid from the additional cleaning liquid supply toward the diffusing member through the through hole, thus allowing the cleaning liquid diffused in the horizontal direction after colliding with the diffusing member to be dispersed to the entire inner peripheral surface of the mist guard.

8. The substrate processing apparatus of claim 7, further comprising:
an additional driving unit configured to rotate the diffusing member around a rotation axis extending in a vertical direction,
wherein the dispersing of the cleaning liquid comprises dispersing the cleaning liquid supplied from the cleaning liquid supply to the entire inner peripheral surface of the mist guard in the state that the substrate is carried out from the holder and the mist guard is raised, and discharging the cleaning liquid from the additional cleaning liquid supply toward the diffusing member through the through hole while rotating the diffusing member by the additional driving unit, thus allowing the cleaning liquid diffused in the horizontal direction after colliding with the diffusing member to be dispersed to the entire inner peripheral surface of the mist guard.

9. The substrate processing apparatus of claim 5, wherein the diffusing member includes a concave curved surface recessed upwards in a state that the diffusing member is disposed above the holder.

10. The substrate processing apparatus of claim 5, further comprising:
a holding arm configured to be moved above the holder,
wherein the diffusing member is detachably mounted to the holding arm, and
the controller is configured to further perform, prior to the dispersing of the cleaning liquid, locating the diffusing member at a position above the holder by holding the diffusing member placed at a standby position at an outside of the mist guard with the holding arm.

11. The substrate processing apparatus of claim 5, further comprising:
a gas supply configured to supply a drying gas to the diffusing member,
wherein the controller is configured to further perform supplying the drying gas from the gas supply to the diffusing member after the dispersing of the cleaning liquid.

12. The substrate processing apparatus of claim 1, wherein the cleaning liquid supply comprises a discharge nozzle configured to radially discharge the cleaning liquid from multiple discharge openings opened on a circumferential surface thereof.

13. The substrate processing apparatus of claim 12, wherein the discharge nozzle is configured such that positions of the multiple discharge openings are allowed to be moved in an up-and-down direction.

14. The substrate processing apparatus of claim 1, further comprising:
a cleaning cup, surrounding at least a lower portion of the mist guard from an outside thereof, configured to store the cleaning liquid therein,
wherein the controller is configured to further perform immersing at least the lower portion of the mist guard in the cleaning liquid within the cleaning cup in a state that the mist guard is lowered.

15. The substrate processing apparatus of claim 14, wherein the immersing of the at least the lower portion of the mist guard is performed prior to the dispersing of the cleaning liquid.

16. The substrate processing apparatus of claim 1, wherein the cleaning liquid supplied from the cleaning liquid supply includes a first liquid and a second liquid selected from an acidic chemical liquid, an alkaline chemical liquid and water, and
the dispersing of the cleaning liquid comprises supplying the first liquid and the second liquid from the cleaning liquid supply while switching the first liquid and the second liquid in turn, thus allowing the first liquid and the second liquid to be sequentially dispersed to the entire inner peripheral surface of the mist guard.

17. The substrate processing apparatus of claim 16, wherein the first liquid is the acidic chemical liquid or the alkaline chemical liquid,
the second liquid is water, and
the dispersing of the cleaning liquid comprises supplying the first liquid and the second liquid from the cleaning liquid supply while switching the first liquid and the second liquid in turn, thus allowing the first liquid and the second liquid to be dispersed to the entire inner peripheral surface of the mist guard in this order.

* * * * *

UNITED STATES PATENT AND TRADEMARK OFFICE
CERTIFICATE OF CORRECTION

PATENT NO. : 12,148,632 B2
APPLICATION NO. : 17/810385
DATED : November 19, 2024
INVENTOR(S) : Yusuke Hashimoto et al.

Page 1 of 1

It is certified that error appears in the above-identified patent and that said Letters Patent is hereby corrected as shown below:

In the Specification

Column 9, Line 43, "Art" should be -- Ar2 --.

Signed and Sealed this
Fourth Day of March, 2025

Coke Morgan Stewart
*Acting Director of the United States Patent and Trademark Office*